US011940218B2

(12) United States Patent
Park

(10) Patent No.: US 11,940,218 B2
(45) Date of Patent: Mar. 26, 2024

(54) INTEGRATED HEATED MEMBER MANAGEMENT SYSTEM AND METHOD FOR CONTROLLING SAME

(71) Applicants: Seung Jae Park, Suncheon-si (KR); EXCELLO CO., LTD., Gwangyang-si (KR)

(72) Inventor: Seung Jae Park, Suncheon-si (KR)

(73) Assignees: Seung Jae Park, Seoul (KR); EXCELLO CO., LTD., Gwangyang-si (KR)

( * ) Notice: Subject to any disclaimer, the term of this patent is extended or adjusted under 35 U.S.C. 154(b) by 1262 days.

(21) Appl. No.: 16/477,192

(22) PCT Filed: Jan. 29, 2018

(86) PCT No.: PCT/KR2018/001207
§ 371 (c)(1),
(2) Date: Jul. 11, 2019

(87) PCT Pub. No.: WO2018/143616
PCT Pub. Date: Aug. 9, 2018

(65) Prior Publication Data
US 2019/0360752 A1 Nov. 28, 2019

Related U.S. Application Data

(63) Continuation-in-part of application No. PCT/KR2017/001086, filed on Feb. 1, 2017, and a
(Continued)

(30) Foreign Application Priority Data

Feb. 1, 2017 (WO) ............... PCT/KR2017/001086
Feb. 28, 2017 (WO) ............... PCT/KR2017/002178
Oct. 24, 2017 (WO) ............... PCT/KR2017/011775

(51) Int. Cl.
*F27D 21/00* (2006.01)
*C21B 7/04* (2006.01)
(Continued)

(52) U.S. Cl.
CPC ............ *F27D 21/0021* (2013.01); *C21B 7/04* (2013.01); *C21C 5/4673* (2013.01); *F27D 21/04* (2013.01); *G01N 27/205* (2013.01)

(58) Field of Classification Search
CPC .. G01M 5/0033; F27D 21/0021; F27D 21/04; C21B 7/04; C21C 5/4673; G01N 27/205
See application file for complete search history.

(56) References Cited

U.S. PATENT DOCUMENTS 4,248,809 A * 2/1981 Sakai ................. F27D 21/0021
264/40.1
4,274,284 A * 6/1981 Hance ................. G01K 13/125
374/E13.013
(Continued)

FOREIGN PATENT DOCUMENTS

CN 103499422 A 1/2014
DE 3424466 A1 * 1/1985
(Continued)

OTHER PUBLICATIONS

International Search Report for PCT/KR2018/001207 dated Apr. 26, 2018 from Korean Intellectual Property Office.
(Continued)

Primary Examiner — Octavia Davis Hollington
(74) Attorney, Agent, or Firm — Revolution IP, PLLC

(57) ABSTRACT

An integrated heated member management system includes: a cable module at least partially inserted into a heated member; a measurement module for measuring information generated in the cable module; an integrated management module for identifying a degree of damage to the heated
(Continued)

member by a molten material on the basis of the information measured by the measurement module, to generate management information relating to the heated member; and a local terminal for receiving, from the integrated management module, the management information relating to the heated member.

18 Claims, 12 Drawing Sheets

Related U.S. Application Data continuation-in-part of application No. PCT/KR2017/002178, filed on Feb. 28, 2017, and a continuation-in-part of application No. PCT/KR2017/011775, filed on Oct. 24, 2017.

(51) Int. Cl.
*C21C 5/46* (2006.01)
*F27D 21/04* (2006.01)
*G01N 27/20* (2006.01)

(56) References Cited

U.S. PATENT DOCUMENTS

| | | | | |
|---|---|---|---|---|
| 4,442,706 | A | * | 4/1984 | Kawate ............... C21B 7/06 266/99 |
| 4,478,395 | A | * | 10/1984 | Dudro, Jr. ........... F27D 3/145 264/30 |
| 4,749,172 | A | * | 6/1988 | Detalle ............... G01N 17/00 374/7 |
| 5,158,366 | A | * | 10/1992 | Nagai ............... F27D 21/0014 374/185 |
| 5,939,136 | A | * | 8/1999 | Cronk ............... G02B 6/245 264/2.3 |
| 10,962,288 | B2 | * | 3/2021 | Park ................... F27D 19/00 |
| 2004/0020278 | A1 | | 2/2004 | McGrarvey et al. |
| 2013/0144554 | A1 | | 6/2013 | Walton et al. |
| 2016/0018341 | A1 | | 1/2016 | Harvill |

FOREIGN PATENT DOCUMENTS

| | | | |
|---|---|---|---|
| DE | 3424466 A1 | | 1/1985 |
| DE | 3503221 A1 | * | 8/1986 |
| FR | 2518240 A1 | | 6/1983 |
| FR | 2576911 A1 | | 8/1986 |
| GB | 1130659 A | | 10/1968 |
| JP | 51-061302 U1 | | 5/1976 |
| JP | 53-122608 A | | 10/1978 |
| JP | 05-240713 A | | 9/1993 |
| JP | 06-047509 A | | 2/1994 |
| JP | 06-313681 A | | 11/1994 |
| JP | 10-259414 A | | 9/1998 |
| JP | 2000-039412 A | | 2/2000 |
| JP | 2000-161868 A | | 6/2000 |
| JP | 2008-275203 A | | 11/2008 |
| JP | 2013-152058 A | | 8/2013 |
| JP | 2014-140857 A | | 8/2014 |
| KR | 20100127329 | * | 4/1984 |
| KR | 20-1999-0021633 U | | 6/1999 |
| KR | 20-0206127 Y1 | | 12/2000 |
| KR | 20110061061 | * | 6/2011 |
| KR | 10-2013-0010392 A | | 1/2013 |
| KR | 10-2013-0035084 A | | 4/2013 |
| KR | 10-2016-0015490 A | | 2/2016 |
| WO | WO-9739371 A1 | * | 10/1997 ......... G02B 6/02123 |

OTHER PUBLICATIONS

International Search Report for PCT/KR2017/001086 dated Oct. 24, 2017 from Korean Intellectual Property Office.
International Search Report for PCT/KR2017/002178 dated Nov. 29, 2017 from Korean Intellectual Property Office.
International Search Report for PCT/KR2017/011775 dated Jul. 18, 2018 from Korean Intellectual Property Office.

* cited by examiner

[FIG. 1]
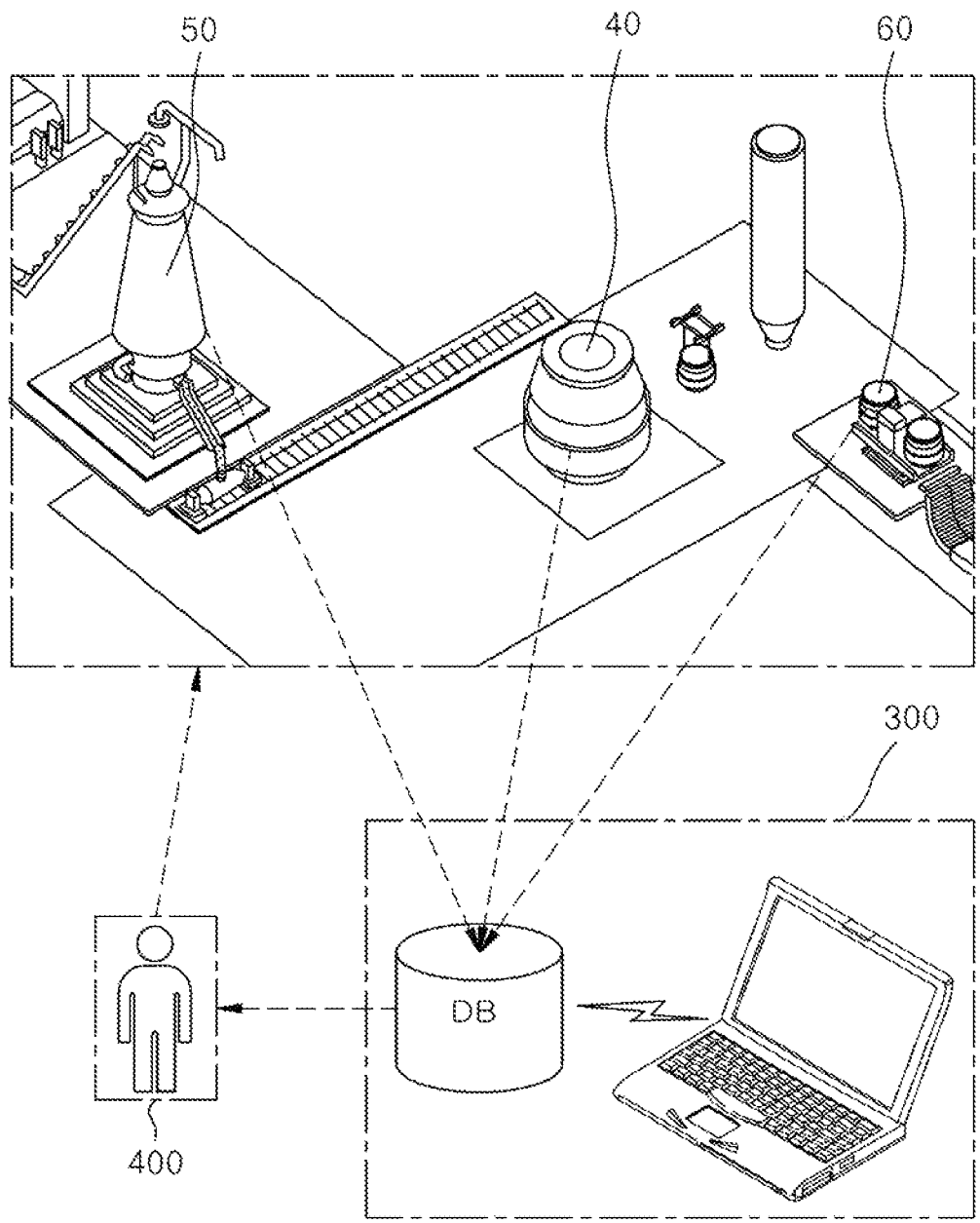

[FIG. 2]
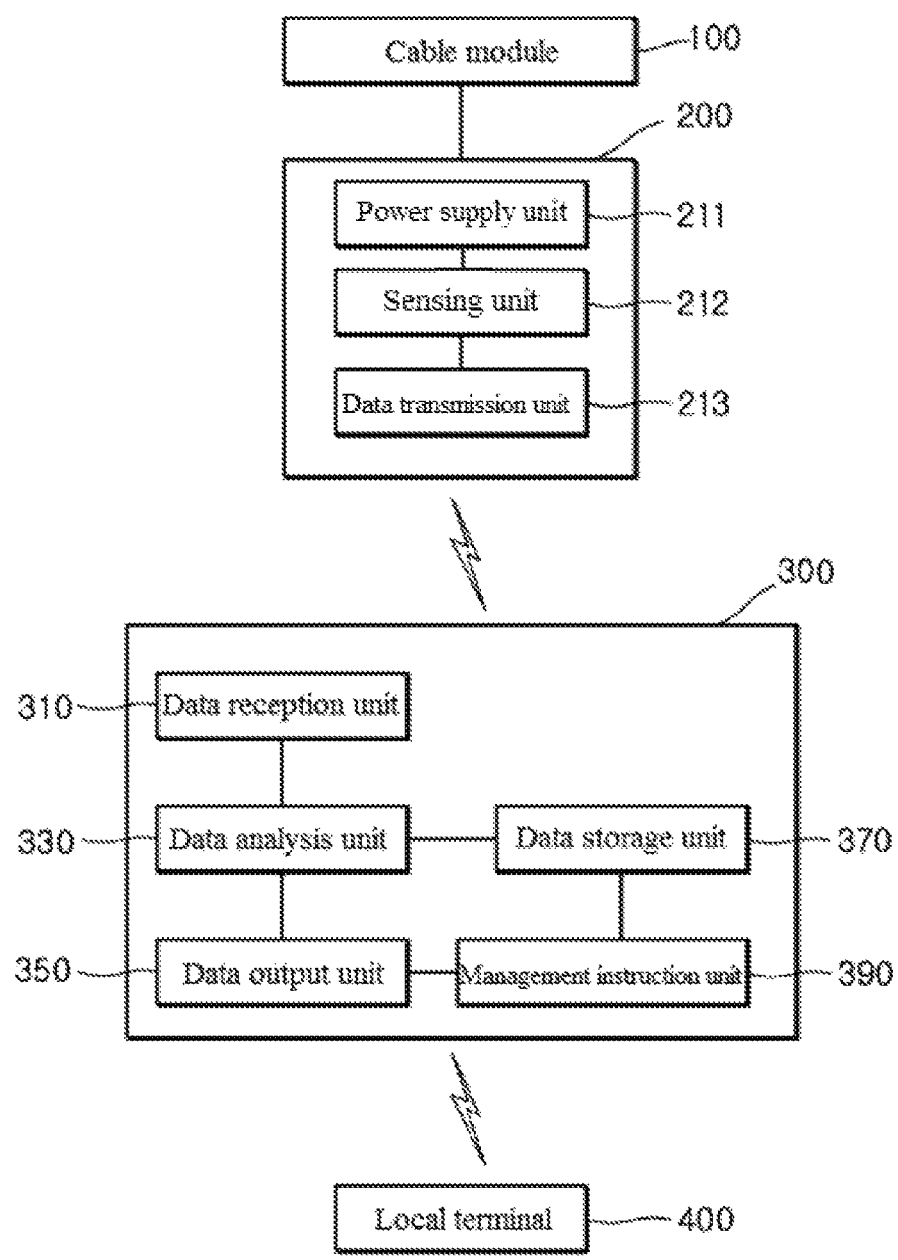

[FIG. 3]
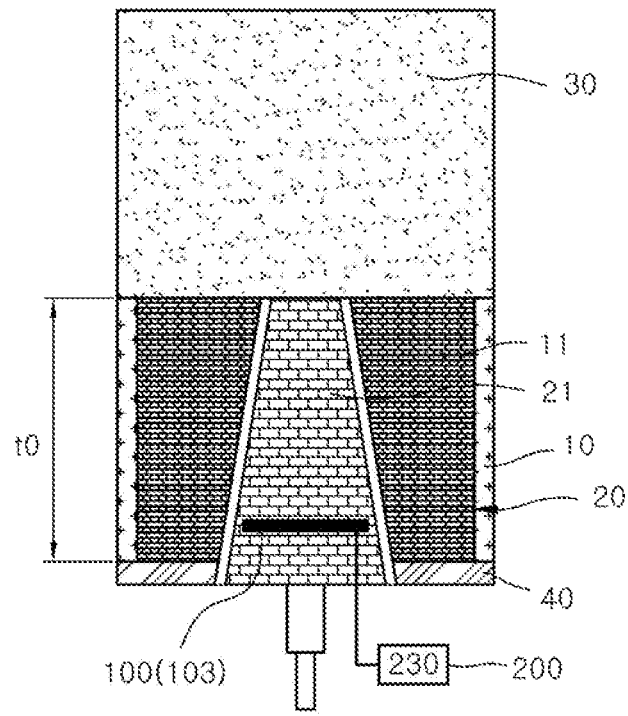
[FIG. 4]
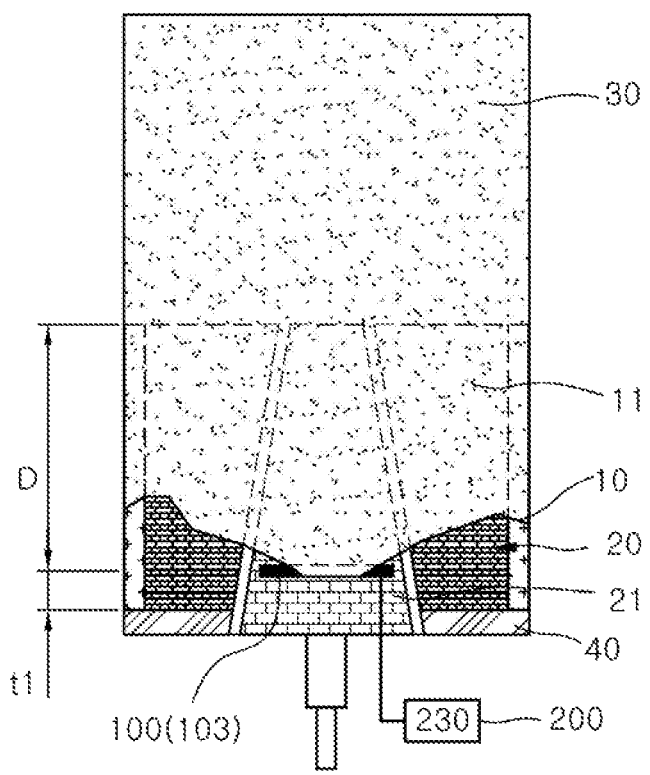

[FIG. 5]
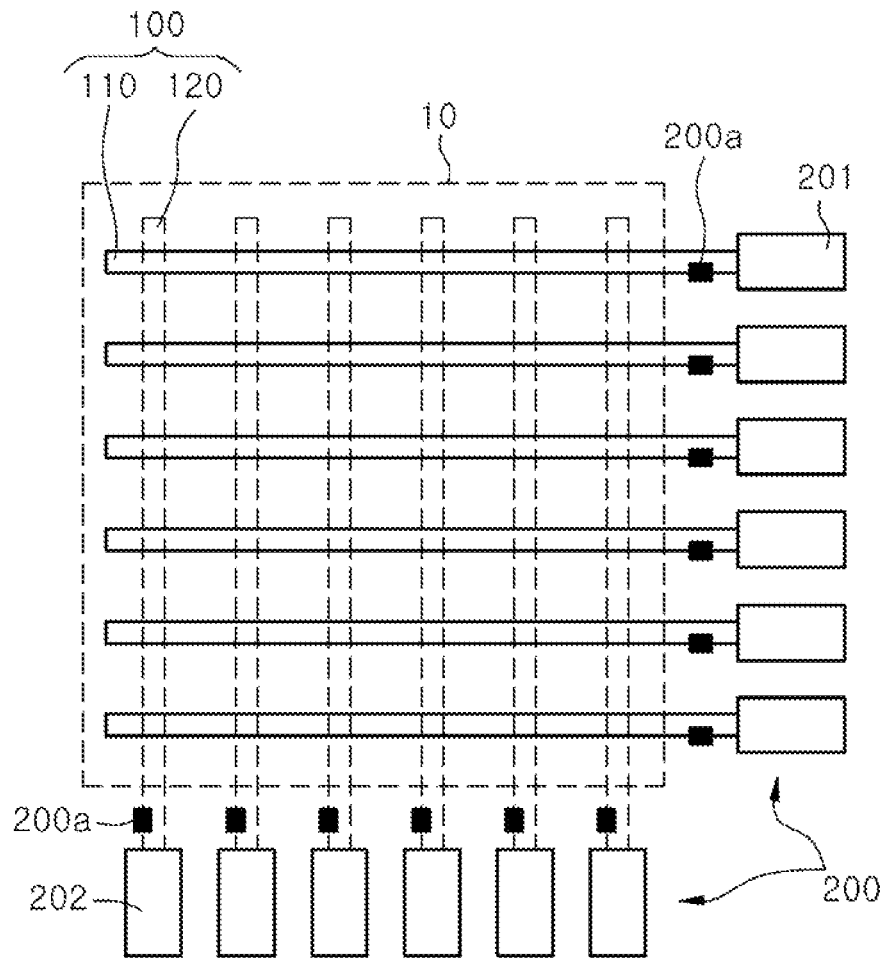
[FIG. 6]
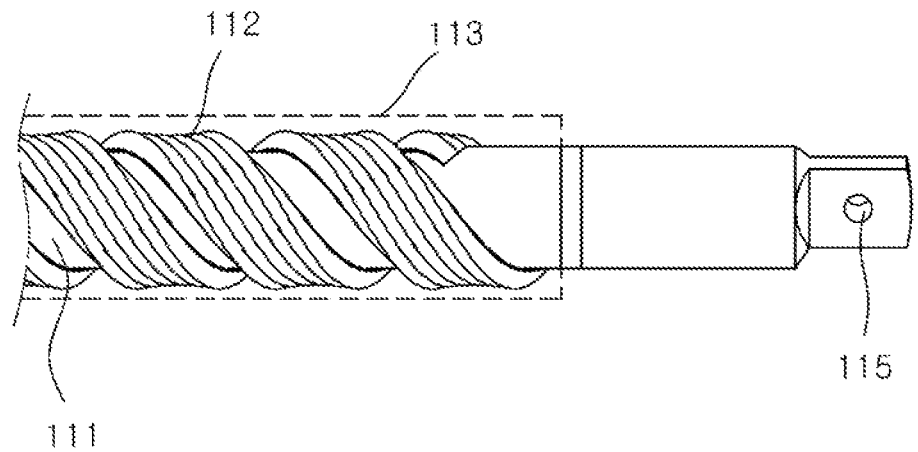

[FIG. 7]
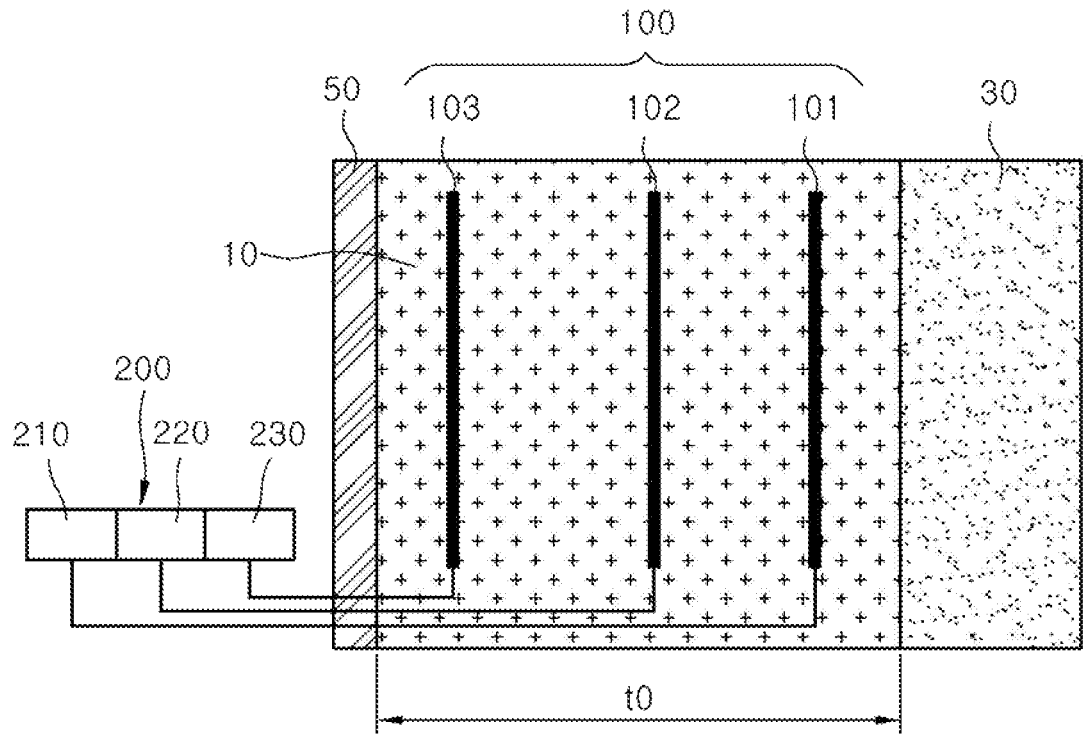
[FIG. 8]
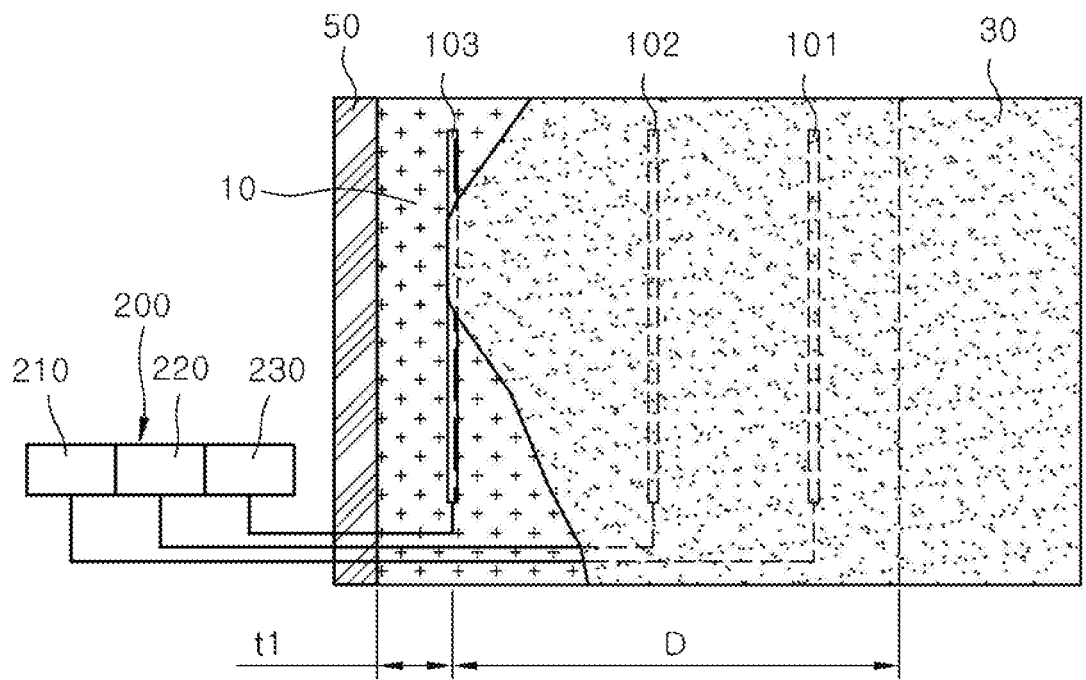

[FIG. 9]
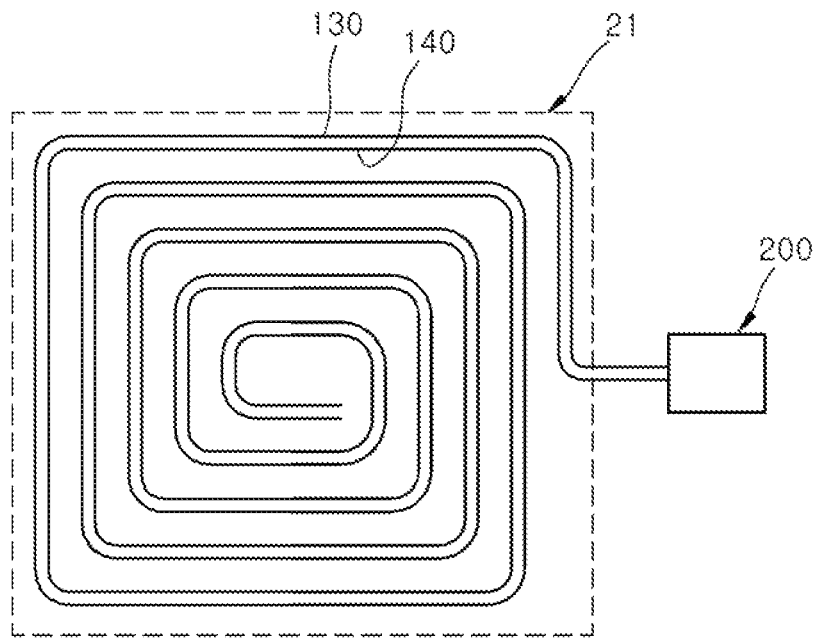
[FIG. 10]
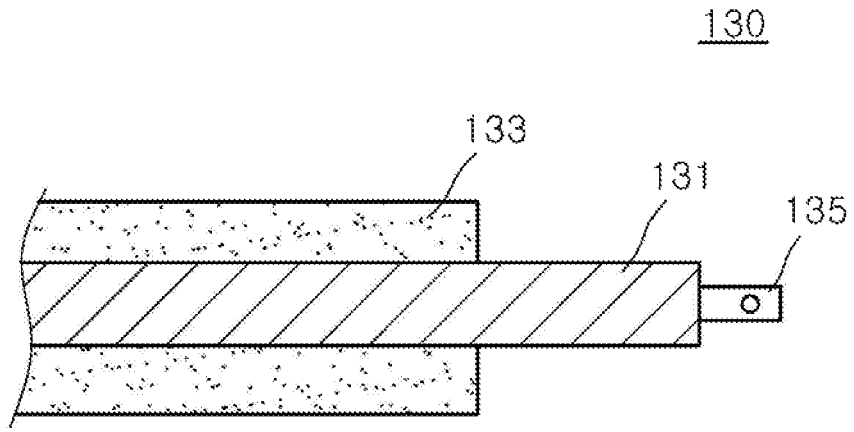

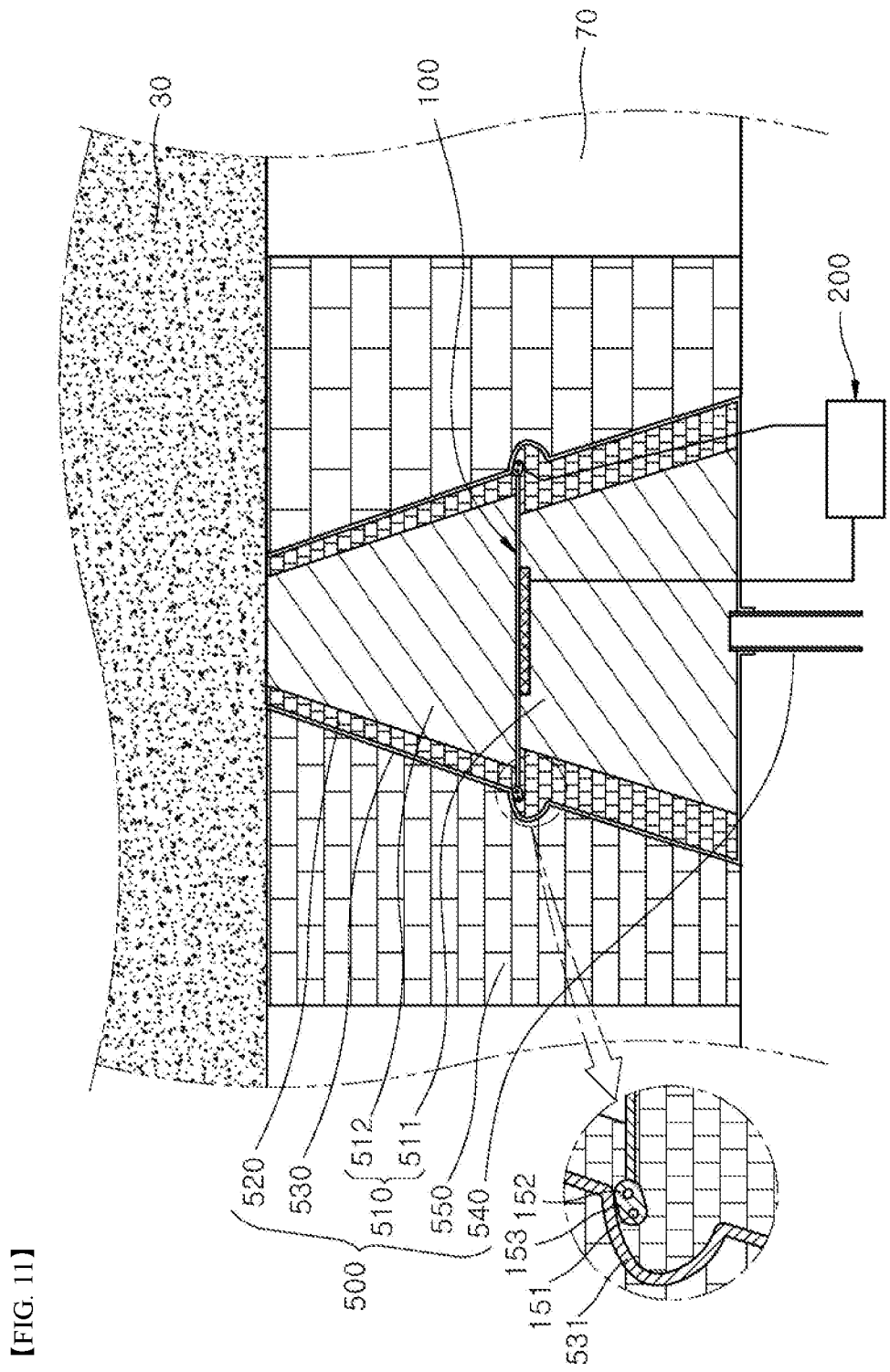
[FIG. 11]

【FIG. 12】
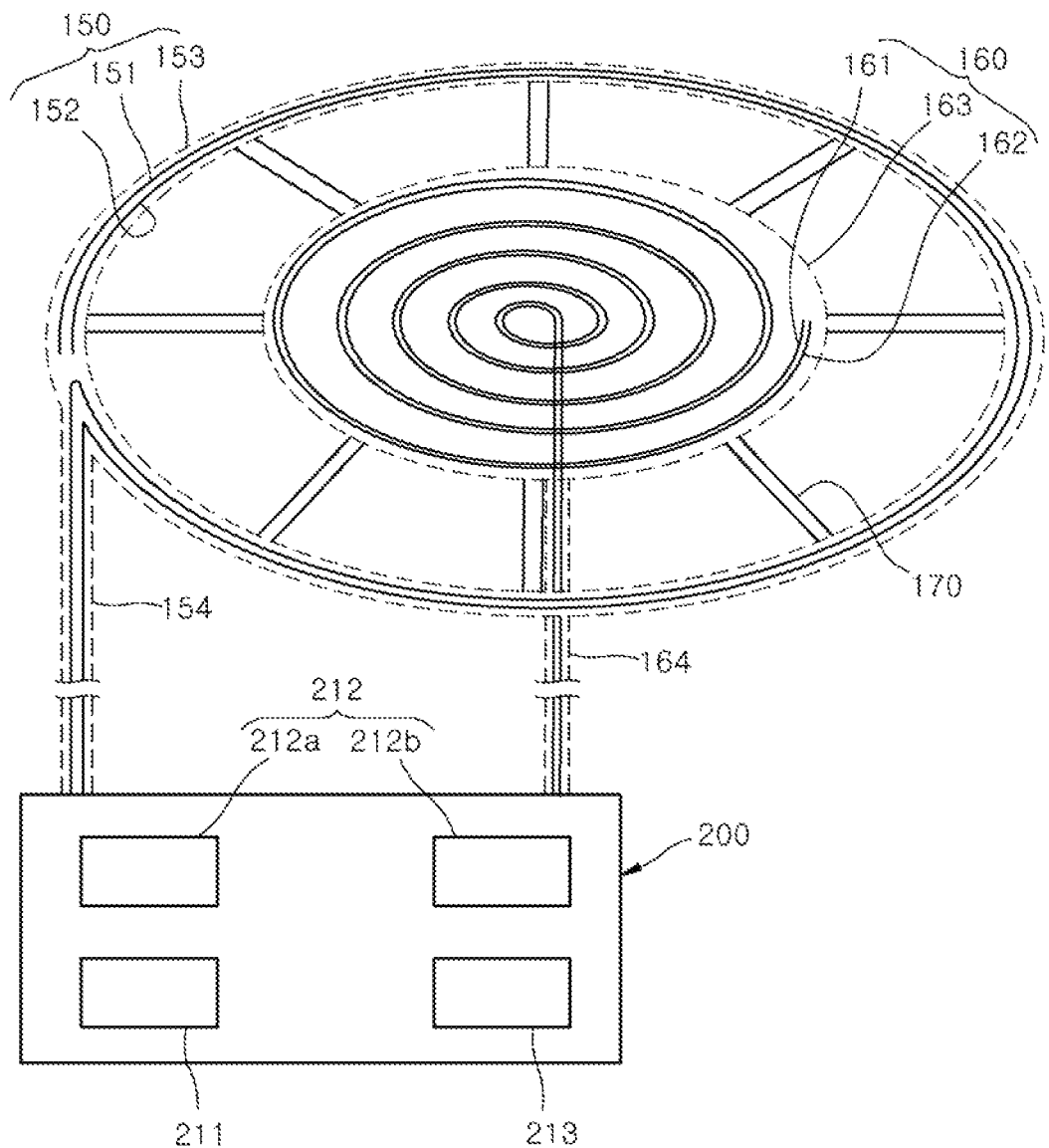

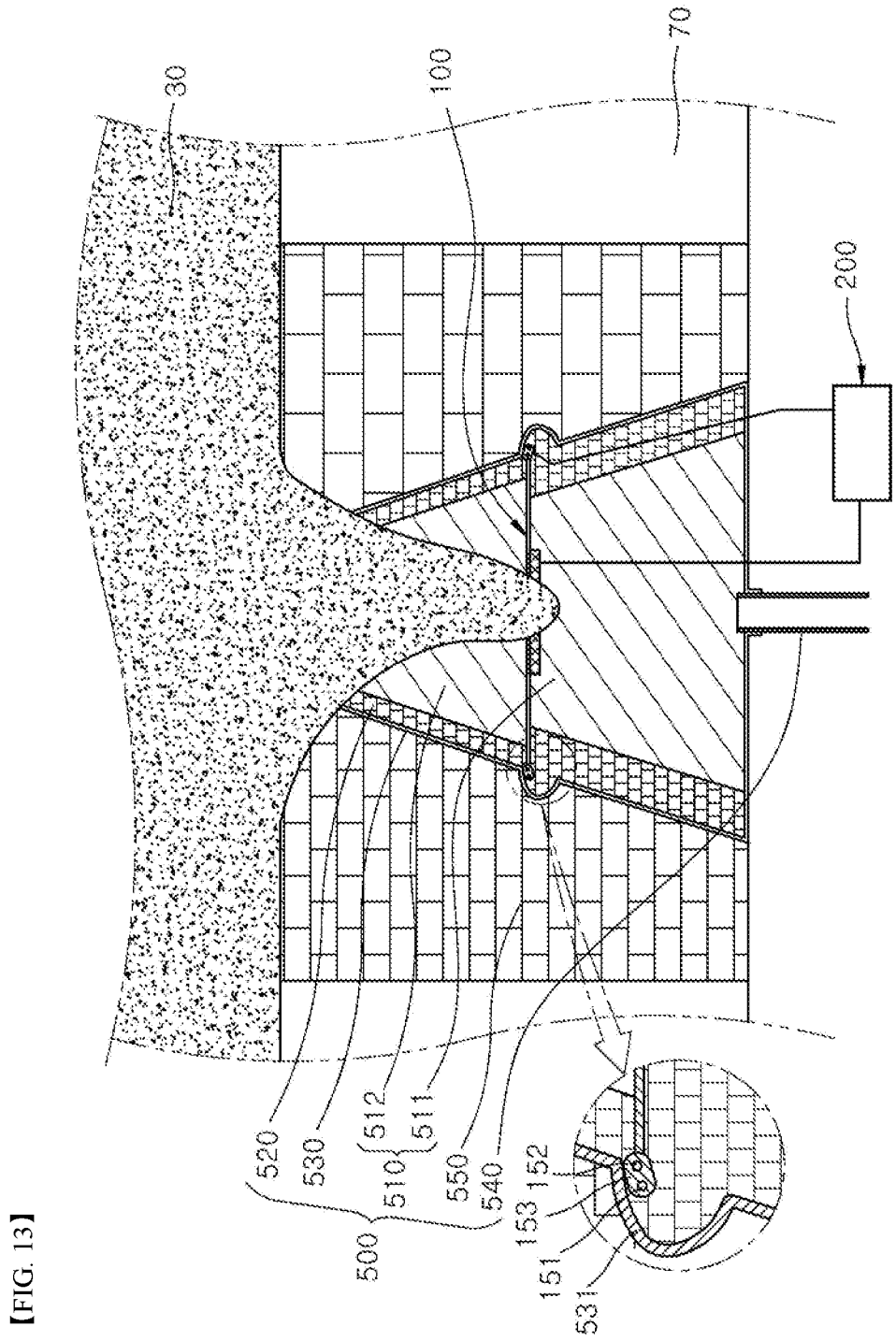
[FIG. 13]

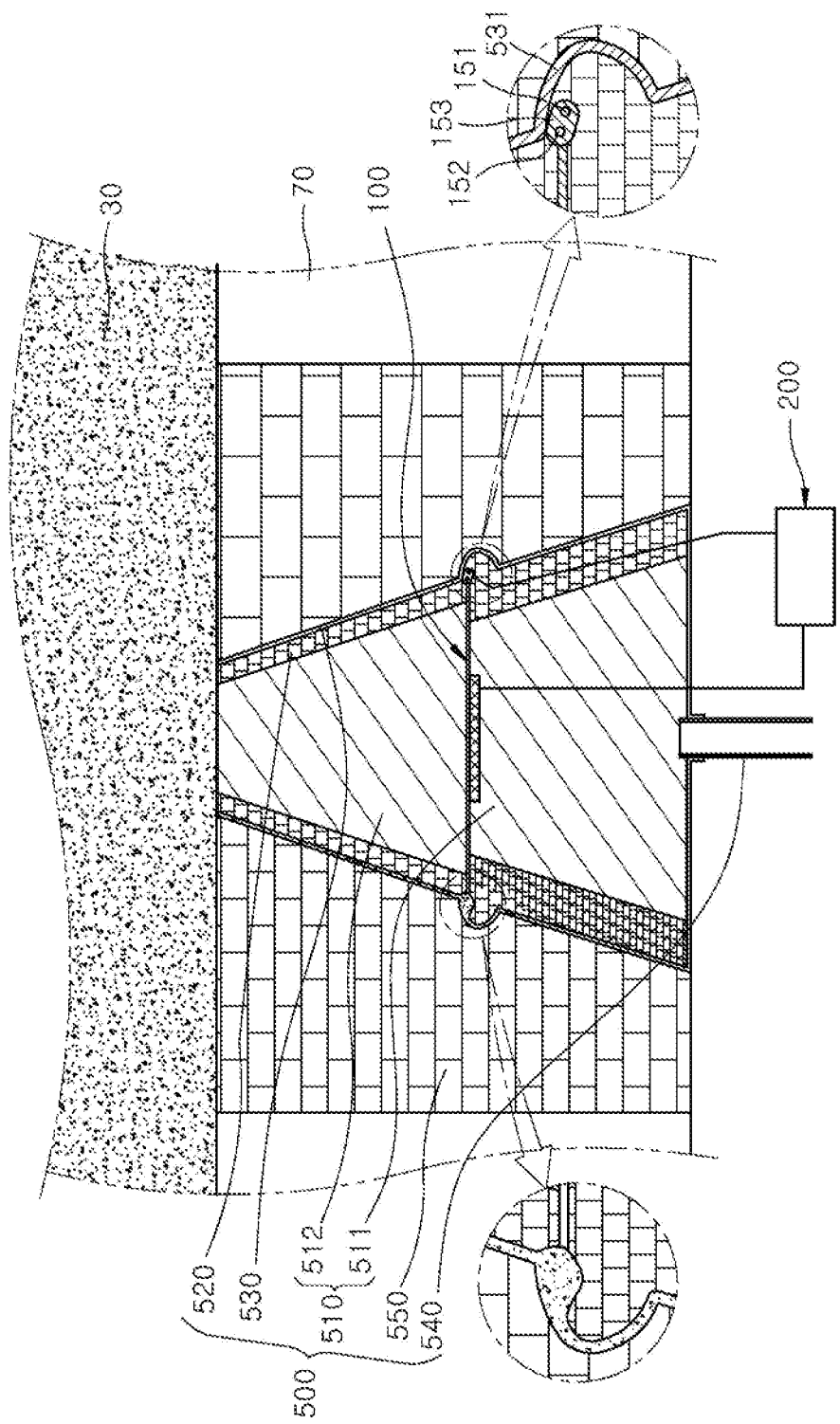

【FIG. 15】
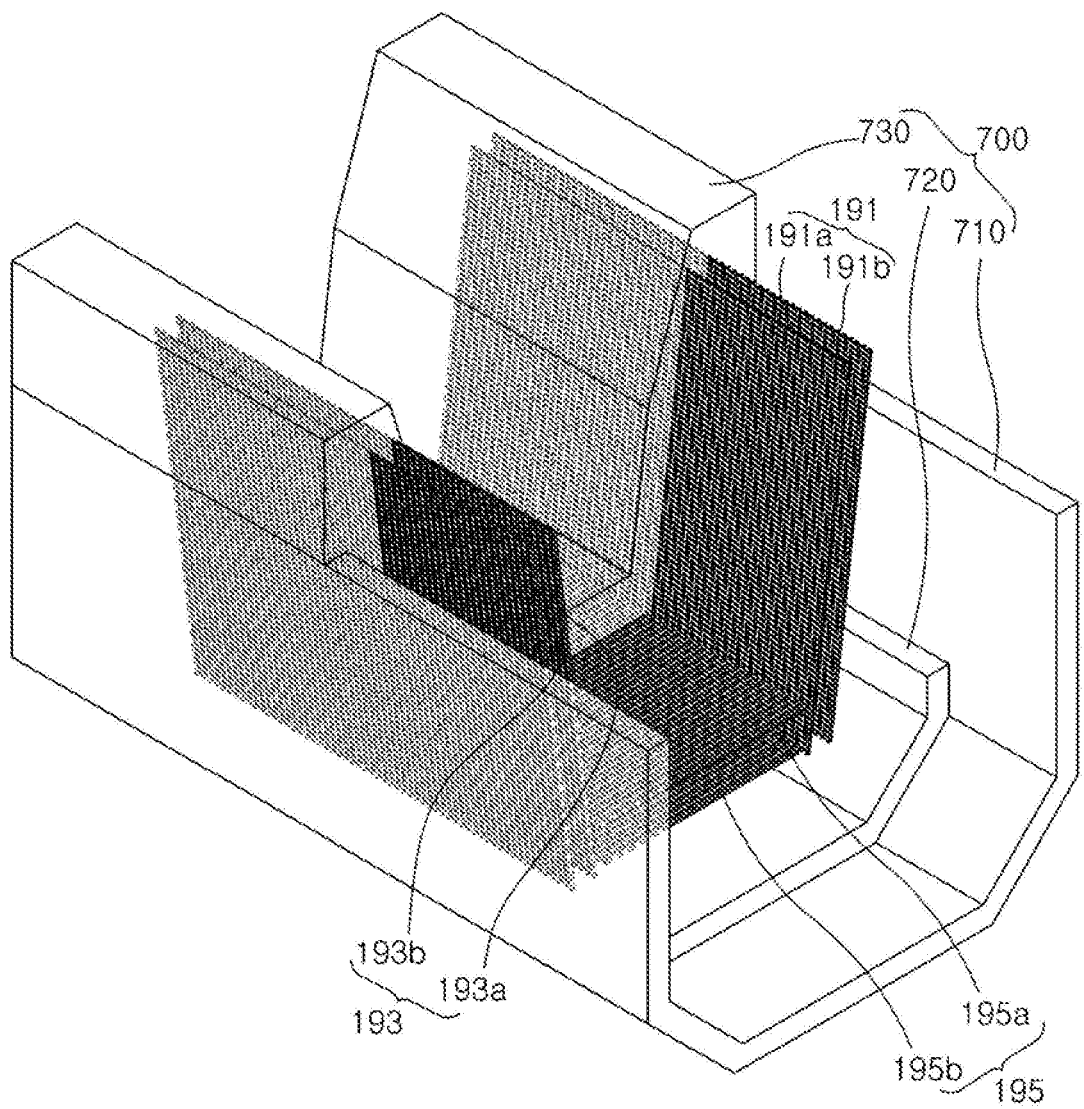

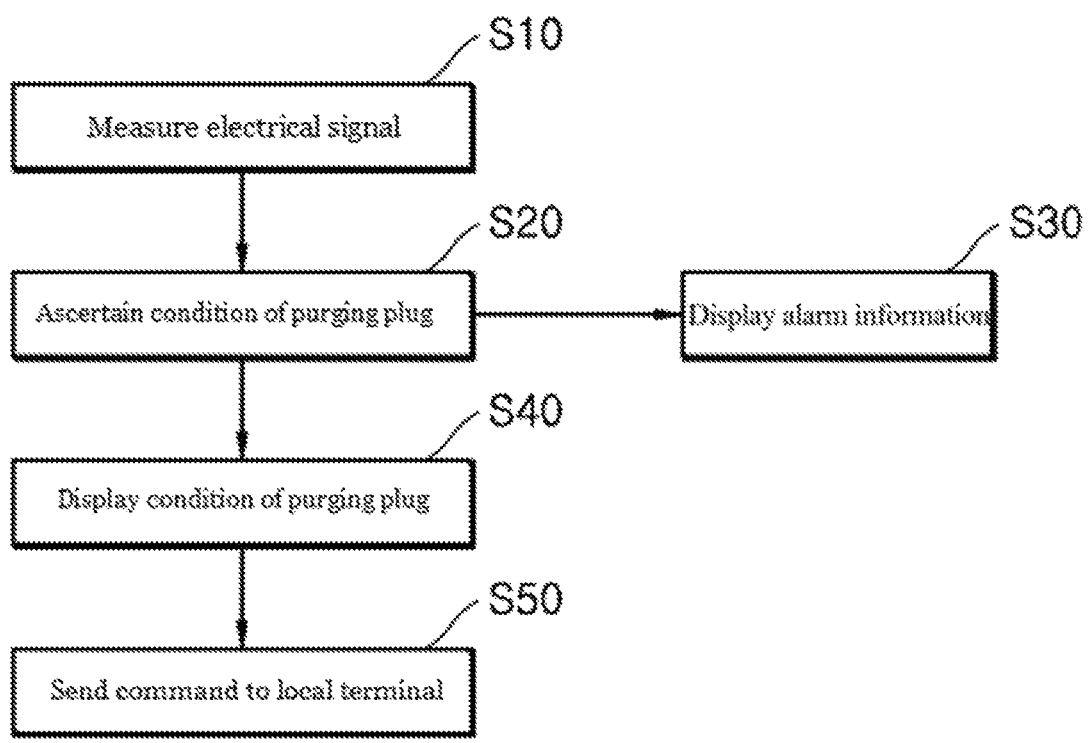
[FIG. 16]

INTEGRATED HEATED MEMBER MANAGEMENT SYSTEM AND METHOD FOR CONTROLLING SAME

CROSS REFERENCE TO PRIOR APPLICATIONS

This application is a National Stage Application of PCT International Patent Application No. PCT/KR2018/001207 filed on Jan. 29, 2018, under 35 U.S.C. § 371, which claims priority to PCT International Patent Application Nos. PCT/KR2017/001086 filed on Feb. 1, 2017, PCT/KR2017/002178 filed on Feb. 28, 2017, and PCT/KR2017/011775 filed on Oct. 24, 2017, which are all hereby incorporated by reference in their entirety.

TECHNICAL FIELD

The present invention relates to an integrated heated member management system and a method for controlling the same, and, more particularly, to an integrated heated member management system which can promptly identify conditions of a heated member to effectively manage the heated member based on a degree of damage to the heated member, and a method for controlling the same.

BACKGROUND ART

Generally, a refractory such as a fire brick and a castable refractory may be disposed in an industrial furnace used in an iron and steel making process, such as a heating furnace, a heat treatment furnace, a calcining furnace, a blast furnace, and a runner.

Such a refractory can be exposed to high-temperature conditions for a long time during a process using an industrial furnace. In this case, the refractory can be damaged due to thermal shock. However, since the refractory is disposed inside the industrial furnace, it is difficult to promptly determine whether the refractory has been damaged. In addition, it is also difficult to ascertain the location and degree of thermal shock-induced damage to the refractory.

If a damaged refractory is not repaired or replaced in time, the industrial furnace is affected by the damaged refractory during the process, causing product defects and deterioration in product quality. Further, the damaged refractory is likely to be separated from an inner wall of the industrial furnace.

When the refractory is separated from the inner wall of the industrial furnace, a molten metal flows out through a gap created due to separation of the refractory, causing heat loss of the industrial furnace, damage to external equipment, and injury to onsite workers.

The background technique of the present invention is disclosed in Korean Patent Publication No. 2013-0035084 (entitled "Electric furnace providing measurement of temperature of refractory" and published on Apr. 8, 2013).

DISCLOSURE

Technical Problem

Embodiments of the present invention have been conceived to solve such a problem in the art and it is an aspect of the present invention to provide an integrated heated member management system which can promptly identify conditions of a heated member to effectively manage the heated member based on a degree of damage to the heated member, and a method for controlling the same.

Technical Solution

In accordance with one aspect of the present invention, there is provided an integrated heated member management system which provides integrated management of damage to a heated member by a hot molten material. The integrated heated member management system includes: a cable module at least partially inserted into the heated member; a measurement module disposed outside the heated member and measuring information generated from the cable module; an integrated management module ascertaining a degree of damage to the heated member by the molten material based on the information measured by the measurement module, displaying a changed condition of the heated member, and generating management information on the heated member; and a local terminal receiving the management information on the heated member from the integrated management module.

The measurement module may measure a resistance value changed as the cable module is damaged due to damage to the heated member by the molten material, and the integrated management module may calculate an insertion location of the damaged cable module based on the changed resistance value and ascertain a penetration depth of the molten material into the heated member based on the insertion location of the damaged cable module.

The cable module may include: a plurality of first unit cables separated from one another; and a plurality of second unit cables separated from one another and crossing the first unit cables, respectively, the measurement module may measure an electrical signal generated from the cable module and may include: first unit measurement units one-to-one coupled to the first unit cables to measure electrical signals generated from the first unit cables; and second unit measurement units one-to-one coupled to the second unit cables to measure electrical signals generated from the second unit cables, and the integrated management module may ascertain a location of damage to the heated member in a plane perpendicular to a thickness direction of the heated member based on locations of the first unit cables and the second unit cables damaged by the molten material.

The integrated heated member management system may further include: a fixed resistance unit disposed between the cable module and the measurement module and having a predetermined resistance value, wherein the cable module, the measurement module, and the fixed resistance unit may form a closed loop.

The heated member may include: a refractory; and a purging plug supplying bubbles to the molten material and coupled to a through-hole formed through the refractory in a thickness direction of the refractory, wherein the purging plug may include a residue measurement block in which at least a portion of the cable module is disposed.

The cable module may include a first cable module and a second cable module disposed adjacent to each other in a thickness direction of the heated member, the measurement module may include a first measurement module measuring a first current value flowing through the first cable module and a second measurement module measuring a second current value flowing through the second cable module, and the integrated management module may calculate an insertion location of the cable module damaged by the molten material based on the first current value and the second current value and may ascertain a penetration depth of the molten material into the heated member based on the insertion location of the damaged cable module.

The measurement module may include: a sensing unit measuring an electrical signal generated from the cable module; and a data transmission unit transmitting the electrical signal measured by the sensing unit to the integrated management module, and the integrated management module may include: a data reception unit receiving the electrical signal from the data transmission unit; a data analysis unit ascertaining the degree of damage to the heated member through analysis of the electrical signal received by the data reception unit; a data output unit displaying the degree of damage to the heated member ascertained by the data analysis unit to monitor condition of the heated member; and a management instruction unit generating management information on the heated member based on the degree of damage to the heated member ascertained by the data analysis unit and transmitting the management information to the local terminal.

The cable module may include a first wire unit and a second wire unit disposed adjacent to one another without being electrically connected to one another, and the measurement module may measure a condition of the cable module including whether the first wire unit is electrically connected to the second wire unit via the molten material penetrating the heated member, and may include a power supply unit to which each of the first wire unit and the second wire unit is individually connected and a sensing unit measuring electric current flowing through the first wire unit and the second wire unit.

The first wire unit may include a metal wire and a coating layer coated on an outer surface of the metal wire to prevent the first wire unit from being electrically connected to the second wire unit during manufacture of the heated member.

The heated member may be a purging plug, the molten material may be a molten metal, the measurement module may measure change in electrical connection state of the cable module due to the molten metal penetrating the purging plug, the cable module may include a first wire unit having a first wire and a second wire disposed adjacent to one another without being electrically connected to one another and a second wire unit having a third wire and a fourth wire and disposed adjacent to one another without being electrically connected to one another, wherein the second wire unit is disposed at a location separated a predetermined distance from the first wire unit inside the purging plug without being electrically connected to the first wire unit, and the electrical connection state of the cable module may be changed as the molten metal contacts at least a portion of the cable module.

The purging plug may include a porous block allowing gas supply to an internal space of a ladle therethrough, an inner refractory block covering the porous block, a block case covering the inner refractory block, an outer refractory block surrounding the block case, and a gas injection pipe allowing gas injection into the porous block therethrough, wherein the block case may include a protrusion protruding toward the outer refractory block and the first wire and the second wire may be disposed on an inner surface of the protrusion.

The cable module may further include a connection member formed of a nonconductive material and physically connecting the first wire unit to the second wire unit.

The first wire unit, the connection member, and the second wire unit may be integrally disposed on the same plane with respect to a bottom surface of the porous block, wherein the first wire unit may be disposed between an inner surface of the block case and an outer surface of the porous block and the second wire unit may be disposed in a central region of the porous block.

The cable module may further include a first connection wire connecting the first wire unit to the measurement module and a second connection wire connecting the second wire unit to the measurement module, the first wire unit may further include a first wire cover covering the first wire and the second wire, and the second wire unit may further include a second wire cover covering the third wire and the fourth wire.

The measurement module may include: a power supply unit to which each of the first wire unit and the second wire unit is individually connected; a first sensor measuring electric current flowing through the first wire unit; a second sensor measuring electric current flowing through the second wire unit; and a data transmission unit transmitting information measured by the first sensor and the second sensor to the integrated management module.

The first sensor may provide the integrated management module with information for determining whether the first wire is electrically connected to the second wire via the molten metal melting the block case while moving along an outer surface of the block case, and the second sensor may provide the integrated management module with information for determining whether the third wire is electrically connected to the fourth wire via the molten metal penetrating the porous block.

The heated member may be a runner refractory disposed in a runner, the cable module may include: a first cable module disposed inside one partition of the runner refractory; a second cable module disposed inside the other partition of the runner refractory; and a third cable module disposed inside a bottom of the runner refractory.

Here, the measurement module may include: a first measurement module connected to the first cable module and measuring an electrical signal generated from the first cable module; a second measurement module connected to the second cable module and measuring an electrical signal generated from the second cable module; and a third measurement module connected to the third cable module and measuring an electrical signal generated from the third cable module.

In accordance with another aspect of the present invention, there is provided a method for controlling the integrated heated member management system set forth above, the method including the steps of: measuring, by the measurement module, information generated from the cable module; ascertaining, by the integrated management module, a degree of damage to the heated member through analysis of the information measured by the measurement module; displaying, by the integrated management module, the degree of damage to the heated member; and generating, by the integrated management module, management information on the heated member and transmitting, by the integrated management module, the management information on the heated member to the local terminal.

The information measured in the step of measuring information generated from the cable module may be an electrical signal related to a resistance value or current value changed as the cable module is damaged due to damage to the heated member by the molten material, and the step of ascertaining the degree of damage to the heated member may include calculating an insertion location of the damaged cable module based on the changed resistance value or current value and ascertaining a penetration depth of the molten material into the heated member based on the insertion location of the damaged cable module.

The information measured in the step of measuring information generated from the cable module may be an electrical signal related to change in electrical connection of the cable module due to the molten material penetrating the purging plug, and the step of ascertaining the degree of damage to the purging plug may include determining whether the molten material reaches a first predetermined location in the purging plug while moving along an outer surface of the block case and determining whether the molten material reaches a second predetermined location in the porous block.

Advantageous Effects

In an integrated heated member management system according to the present invention and a method for controlling the same, when a heated member disposed in various industrial furnaces is damaged by thermal shock, conditions of the heated member can be promptly ascertained, thereby allowing effective management of the heated member based on a degree of damage to the heated member.

In addition, the present invention can be applied to various industrial furnaces to manage the heated member disposed in the industrial furnace so as to prevent heat loss of the industrial furnace, damage to external equipment, and accidents to onsite workers due to damage to the heated member.

Further, according to the present invention, with mesh-structured cable modules arranged in a multistage manner, a penetration depth of a molten material into the heated member can be ascertained, thereby allowing easy ascertainment of the degree of damage to the heated member.

Further, according to the present invention, with the mesh-structured cable module, a location of thermal shock-induced damage to the heated member in a plane perpendicular to a thickness direction of the heated member and the degree of thermal shock-induced damage to the heated member can be easily ascertained.

Further, according to the present invention, with a fixed resistance unit connected to the cable module, a resistance value generated from the cable module can be accurately measured and thus the degree of damage to the heated member can be precisely ascertained.

Further, according to the present invention, the degree of damage to the heated member can be easily and accurately ascertained based on the phenomenon that two adjacent wire units electrically disconnected to each other are electrically connected to each other via the molten material.

Further, according to the present invention, with a first wire unit disposed between an inner surface of a block case and an outer surface of a porous block and a second wire unit disposed in a central region of the porous block, it is possible to easily determine whether a molten metal penetrates the purging plug while flowing along an outer surface of the block case and whether the molten metal penetrates the porous block.

DESCRIPTION OF DRAWINGS

FIG. 1 is a schematic view of an integrated heated member management system according to a first embodiment of the present invention.

FIG. 2 is a block diagram of the integrated heated member management system according to the first embodiment.

FIG. 3 is a view of the integrated heated member management system according to the first embodiment, showing placement of a cable module in a purging plug disposed in a steel making furnace.

FIG. 4 is a view of the integrated heated member management system according to the first embodiment, showing damage to a purging plug disposed in a steel making furnace.

FIG. 5 is a view of the integrated heated member management system according to the first embodiment, showing placement of a cable module in a refractory disposed in a steel making furnace.

FIG. 6 is a view of the integrated heated member management system according to the first embodiment, showing damage to a refractory disposed in a steel making furnace.

FIG. 7 is a view of the integrated heated member management system according to the first embodiment, showing placement of a cable module in a refractory disposed in an iron making furnace.

FIG. 8 is a view of the integrated heated member management system according to the first embodiment, showing damage to a refractory disposed in an iron making furnace.

FIG. 9 is a view showing placement of a cable module in an integrated heated member management system according to a second embodiment of the present invention.

FIG. 10 is a view of a first wire unit of a cable module in the integrated heated member management system according to the second embodiment.

FIG. 11 is a view of an integrated heated member management system according to a third embodiment of the present invention, showing placement of a cable module in a purging plug disposed in a steel making furnace.

FIG. 12 is a view showing main components of a cable module and a measurement module according to the third embodiment.

FIG. 13 is a view of the integrated heated member management system according to the third embodiment, showing penetration of a molten metal into a purging plug through a porous block.

FIG. 14 is a view of the integrated heated member management system according to the third embodiment, showing penetration of a molten metal into a purging plug along an outer surface of a block case.

FIG. 15 is a fragmentary perspective view of an integrated heated member management system according to a fourth embodiment of the present invention, showing placement of a cable module in a runner.

FIG. 16 is a flowchart of a method for controlling an integrated heated member management system according to one embodiment of the present invention.

BEST MODE

Hereinafter, exemplary embodiments of the present invention will be described in detail with reference to the accompanying drawings. It should be understood that the embodiments are provided for illustration only and are not to be in any way construed as limiting the present invention. In addition, description of known functions and constructions which may unnecessarily obscure the subject matter of the present invention will be omitted.

Now, an integrated heated member management system according to a first embodiment of the present invention will be described with reference to FIG. 1 to FIG. 8.

The integrated heated member management system according to the first embodiment of the invention is a system for integrated management of damage to a heated member by a hot molten material 30. Here, the molten material 30 is contained in an industrial furnace.

The integrated heated member management system according to the first embodiment includes a heated member, a cable module 100, a measurement module 200, an integrated management module 300, and a local terminal 400.

The heated member is disposed inside the industrial furnace to prevent the molten material 30 from contacting an outer wall of the industrial furnace. That is, the heated member prevents the outer wall of the industrial furnace from being damaged by the molten material 30.

The heated member may be formed of a refractory, such as a fire brick and a castable refractory. Alternatively, the heated member may be formed of glass, cement, or the like. Alternatively, the heated member may be formed of a mixture of a refractory and glass or a mixture of a refractory and cement. However, it should be understood that the present invention is not limited thereto and the heated member may be formed of any suitable material for preventing contact between the molten material and the outer wall of the industrial furnace.

In the first embodiment, the heated member is described as formed of a refractory 10. Thus, the refractory 10 is disposed inside the industrial furnace.

The cable module 100 is at least partially inserted into the refractory 10. The cable module 100 may allow electric current to flow therethrough. Both ends of the cable module 100 are exposed outside the refractory 10 to be connected to the measurement module 200 disposed outside the refractory 10.

In manufacture of the refractory 10 with the cable module 100 embedded therein, the cable module 100 is independently disposed at different locations inside the refractory 10 in a thickness direction of the refractory 10 depending on the shape and size of the refractory 10. Herein, the thickness t0 of the refractory 10 refers to the distance from the outer wall of the industrial furnace to a portion of the refractory 10 contacting the molten material 30 inside the industrial furnace, and the thickness direction of the refractory 10 refers to a direction from the portion of the refractory 10 contacting the molten material 30 to the outer wall of the industrial furnace. The cable module 100 will be described in detail below.

The measurement module 200 is disposed outside the refractory 10. The measurement module 200 measures information generated from the cable module 100. The information measured by the measurement module 200 changes as the cable module 100 is damaged due to damage to the refractory 10 by the molten material 30. In addition, an electrical signal measured by the measurement module 200 changes as conditions of the refractory 10 are changed due to detachment, melting, cracking, breakage, and erosion of the refractory 10.

The information measured by the measurement module 200 may be an electrical signal such as a resistance value and a current value.

The measurement module 200 includes a sensing unit 212 and a data transmission unit 213.

The sensing unit 212 measures an electrical signal generated from the cable module 100. In the first embodiment of the invention, the sensing unit 212 measures a resistance value generated from the cable module 100.

The data transmission unit 213 transmits the resistance value measured by the sensing unit 212 to the integrated management module 300.

However, it should be understood that the present invention is not limited thereto and the measurement module 200 may further include an alarm unit.

The alarm unit displays alarm information when the refractory 10 is not in a normal state such that an onsite manager can check the condition of the refractory.

The alarm information and a signal for controlling the alarm unit may be transmitted from the integrated management module 300. The alarm unit may be disposed adjacent to the refractory 10 to indicate the condition of the refractory 10 with an alarm sound and an indicator light.

Tone of the alarm sound and color of the indicator light may be varied depending on the degree of damage to the refractory 10, whereby an onsite worker can ascertain the degree of damage to the refractory in real time, thereby allowing prompt repair or replacement of the refractory 10.

The integrated management module 300 ascertains the degree of damage to the refractory 10 by the molten material 30 based on the information measured by the measurement module 200, displays the degree of damage to the refractory 10, and generates management information on the refractory 10.

The integrated management module 300 includes a data reception unit 310, a data analysis unit 330, a data storage unit 350, a data output unit 370, and a management instruction unit 390.

The data reception unit 310 receives information from the data transmission unit 230 and transmits the information to the data analysis unit 330.

The data analysis unit 330 ascertains the degree of damage to the refractory 10 through analysis of the information received from the data reception unit 310. Information on the conditions of the refractory 10 is stored in the data storage unit 350.

Specifically, the data analysis unit 330 analyzes the information measured by the measurement module 200 based on data conversion criteria stored in the data storage unit 350. In the data conversion criteria, condition of the refractory may be defined according to corresponding information.

Accordingly, the degree and location of damage to the refractory 10 can be ascertained from results of analysis of the information by the data analysis unit 330.

The results of analysis may include information on rupture of the refractory 10, information on noise caused by molten metal penetrating cracks of the refractory 10, and information changed by heat from the refractory 10.

Based on the information changed by heat from the refractory 10, the degree and location of cracking of the refractory 10 can be ascertained, thereby allowing determination as to the starting time point, pace, and degree of damage to the refractory 10.

Accordingly, an onsite operator can easily ascertain the location and degree of damage to the refractory 10 based on the information.

Since an onsite operator or a person in charge can more promptly and accurately ascertain the location and degree of damage to the refractory 10, the refractory 10 can be quickly repaired or replaced, thereby minimizing the risk of safety accidents.

The data analysis unit 330 may determine the management information on the refractory 10 based on information on the quantity and history of the refractories 10 stored in the data storage unit 350.

Specifically, the data analysis unit 330 may ascertain, in real time, a stock of a damaged refractory among the refractories 10 disposed in respective regions of the industrial furnace and a product history, such as product name, manufacturer, manufacturing date, warehousing date, and lot number of the refractory 10.

Information on the degree of damage to the refractory 10 stored in the data storage unit 350 may be used to determine when and how often to replace the refractory 10.

Specifically, the defect rate, failure rate, and usage rate of the refractory 10 may be ascertained through analysis of the information on the degree of damage to the refractory 10 stored in the data storage unit 350, and may be used by the integrated management module 300 to manage a damage history of the refractory 10.

The data output unit 370 displays the degree of damage to the refractory 10, the stock of the refractory, the product history of the refractory, and the damage history of the refractory 10.

The management instruction unit 390 transmits the management information on the refractory 10 to the local terminal 400 such that an onsite manager and a person in charge can ascertain the degree of damage to the refractory 10 in real time.

Accordingly, an onsite manager and a person in charge can promptly repair or replace the refractory 10.

In particular, the integrated management module 300 may calculate an insertion location of the damaged cable module 100 based on the changed information and may ascertain a penetration depth D of the molten material 30 into the refractory 10 based on the insertion location of the damaged cable module 100.

In addition, the integrated management module 300 may ascertain a location of damage to the refractory 10 in a plane perpendicular to the thickness direction of the refractory 10 based on locations of a first unit cable 110 and second unit cable 120 in the cable module 100 which have been damaged by the molten material 30. The first unit cable 110 and the second unit cable 120 will be described further below.

The local terminal 400 receives the management information on the refractory 10 from the integrated management module 300. The local terminal 400 may be an onsite manager's or person in charge's laptop or mobile phone.

A management command transmitted to the local terminal 400 may be varied depending on the condition of the refractory 10, whereby an onsite manager and a person in charge can perform management according to the condition of the refractory 10.

The integrated refractory management system including the cable module 100, the measurement module 200, the integrated management module 300, and the local terminal 400 enables integrated management of the refractory 10 and real-time monitoring of the condition of the refractory 10, thereby minimizing the number of onsite personnel required to manage the refractory 10.

Referring to FIG. 5, the cable module 100 according to the first embodiment includes a plurality of first unit cables 110 separated from one another and a plurality of second unit cables 110 separated from one another and crossing the respective first unit cables 110. Thus, the cable module 100 has a mesh structure in a plane perpendicular to the thickness direction of the refractory 10.

Accordingly, a location of damage to the refractory 10 in the plane can be easily ascertained by being plotted in coordinates based on damage-induced change in resistance value on the first unit cables 110 and second unit cables 120 in the mesh structure as shown in FIG. 5.

Since the first unit cable 110 has substantially the same structure as the second unit cable 120, details of only the first unit cable 110 will now be described with reference to FIG. 6.

The first unit cable 110 includes a metal wire 111 and a space-securing coating layer 113.

The metal wire 111 has a protuberance 112 formed along at least a portion of an outer surface thereof. The protuberance 112 may protrude from the outer surface of the metal wire 111 to have a saw-tooth shape. In addition, the metal wire 111 is provided at opposite ends thereof with connection terminals 115 for connection to the measurement module 200.

The metal wire 111 may be provided in the form of a screw having an uneven surface. Thus, the metal wire 111 can have a larger surface area per unit length than a typical metal wire having a circular cross-section. Further, due to the protuberance 112 protruding from the circumferential surface of the metal wire 111, a surface area of the metal wire 111 contacting the refractory 10 can be increased.

As a result, the metal wire 111 having a screw shape and the protuberance 112 having a saw-tooth shape can hold the refractory 10, whereby coupling between the cable module 100 and the refractory 10 can be reinforced.

In addition, a portion of the outer surface of the metal wire 111 may be irregularly indented to further increase a surface area of the metal wire 111 contacting the refractory 10.

However, it should be understood that the present invention is not limited thereto, the first unit cable 110 may include the metal wire 111 and a refractory binding member irregularly bonded to at least a portion of the outer surface of the metal wire 111.

The refractory binding member may be formed of metal fibers, such as hot fibers, and is attached to the outer surface of the metal wire 111 to be embedded in the refractory 10 to firmly stick to materials constituting the refractory 10.

As a result, coupling between the refractory 10 and the first unit cable 110 can be reinforced, thereby suppressing separation of the first unit cable 110 from the refractory 10.

The metal wire 111 may be formed of SUS, which is highly resistant to heat, to be prevented from being easily melted or expanded by heat transferred from the refractory 10.

However, it should be understood that the present invention is not limited thereto and the metal wire 111 may be formed of any metal that is highly resistant to heat and has good current-carrying properties.

In addition, the metal wire 111 may have a structure in which a copper wire is centered to secure good current-carrying properties and a SUS wire surrounds the copper wire to prevent the copper wire from being easily melted by heat from the refractory 10.

The space-securing coating layer 113 is coated onto at least a portion of the outer surface of the metal wire 111 and provides a space for expansion of the metal wire by being melted upon temperature rise of the refractory 10.

When the metal wire 111 expands due to increase in temperature of the refractory 10, the metal wire 111 fills at least a portion of the space formed by the space-securing coating layer 113.

As a result, the space-securing coating layer 113 is melted by heat transferred from the refractory 10 and is discharged outside the refractory 10 in the form of a coating liquid.

However, it should be understood that the present invention is not limited thereto and a storage tank may be disposed outside the refractory 10 to receive and store the discharged coating liquid.

The storage tank not only receives and stores the coating liquid, but also serves to guide the coating liquid to be introduced back into the refractory 10.

The space-securing coating layer 113 may be formed of paraffin.

However, it should be understood that the present invention is not limited thereto and the space-securing coating layer 113 may be formed of any material that has a lower melting point than the metal wire, is easy to coat, and does not have current-carrying properties.

The measurement module 200 may include first unit measurement units 201 coupled one-to-one to the first unit cables 110 to measure resistance values generated from the first unit cables 110 and second unit measurement units 202 coupled one-to-one to the second unit cables 120 to measure resistance values generated from the second unit cables 120.

The first unit measurement unit 201 has substantially the same structure as the second unit measurement unit 202. Each of the first unit measurement unit 201 and the second unit measurement unit 202 may include the sensing unit 212 and the data transmission unit 213.

The integrated refractory management system according to the first embodiment of the invention may further include a fixed resistance unit 200a.

Here, the cable module 100, the measurement module 200 and the fixed resistance unit 200a form a closed loop together.

The fixed resistance unit 200a has a predetermined resistance value. The fixed resistance unit 200a is disposed outside the refractory 10. The fixed resistance unit 200a is disposed between the cable module 100 and the measurement module 200 to electrically connect the cable module 100 to the measurement module 200.

The fixed resistance unit 200a can clarify change in resistance value generated from the cable module 100 and reduce errors of the resistance value measured by the measurement module 200.

Next, arrangement of the cable module 100 and the measurement module 200 with respect to the refractory 10 disposed in a steel making furnace 40 as the industrial furnace in an integrated heated member management system according to a second embodiment of the present invention will be described with reference to FIG. 3 and FIG. 4.

The refractory 10 inside the steel making furnace 40 has a through-hole 11 formed therethrough in the thickness direction thereof. Due to the characteristics of the steel making furnace 40, the through-hole 11 is coupled to a purging plug 20 which is provided therein with a residue measurement block 21 to be damaged by the molten material 30 and supplies bubbles to the molten material 30. Both the purging plug 20 and the residue measurement block 21 may be damaged faster than the refractory 10.

Here, the cable module 100 may include a third cable module 103 disposed inside the residue measurement block 21 to alert to replacement time of the purging plug 20. The third cable module 103 may include the first unit cable 110 and the second unit cable 120. Correspondingly, the measurement module 200 may include a third measurement module 230 measuring an electrical signal generated from the third cable module 103. The third measurement module 230 may include the first unit measurement unit 201 and the second unit measurement unit 202.

Referring to FIG. 4, the purging plug 20 is coupled to the through-hole 11 corresponding to the thickness t0 of the refractory and the residue measurement block 21 is embedded in the purging plug 20. The third cable module 103 is embedded in the residue measurement block 21. In addition, the third measurement module 230 is connected to the third cable module 103.

As the refractory 10 is damaged by the molten material 30, the molten material 30 penetrates the refractory 10, as shown in FIG. 4. Since the third cable module 103 is embedded in a boundary line t1 of the residue measurement block 21, when the molten material 30 penetrates the refractory 10 to a depth of "D", the third cable module 103 embedded in the refractory 10 to alert to the replacement time of the purging plug 20 is damaged, resulting in change of the electrical signal measured by the third measurement module 230.

Accordingly, the integrated management module 300 can calculate an insertion position of the damaged cable module 100 based on the changed electrical signal and ascertain a penetration depth of the molten material 30 into the refractory 10 based on the insertion position of the damaged cable module 100.

In addition, the integrated management module 300 can ascertain a location of damage to the refractory 10 in a plane perpendicular to the thickness direction of the refractory 10 based on locations of the first unit cable 110 and the second unit cable 120 damaged by the molten material 30.

Next, arrangement of the cable module 100 and the measurement module 200 with respect to the refractory 10 disposed in an iron making furnace 50, as the industrial furnace, in the integrated heated member management system according to the second embodiment of the invention will be described with reference to FIG. 7 and FIG. 8.

When the refractory 10 is disposed in the iron making furnace 50, the cable module 100 may be divided into a first cable module 101, a second cable module 102 and a third cable module 103.

The first cable module 101 and the second cable module 102 are arranged inside the refractory 10 in the thickness direction of the refractory 10 from a boundary between the refractory 10 and the molten material 30. Specifically, the first cable module 101 may be spaced apart from the boundary of the refractory 10 and the molten material 30 in the thickness direction of the refractory 10 and the second cable module 102 may be spaced apart from the first cable module 101 in the thickness direction of the refractory 10.

The third cable module 103 is spaced apart from the second cable module 102 in the thickness direction of the refractory 10. The third cable module 103 is disposed inside the refractory 10 to alert to the replacement time of the refractory 10.

Here, each of the first cable module 101, the second cable module 102, and the third cable module 103 may include the first unit cable 110 and the second unit cable 120.

Correspondingly, the measurement module 200 may be divided into a first measurement module 210, a second measurement module 210, and a third measurement module 230.

The first measurement module 210 measures an electrical signal generated from the first cable module 201, the second measurement module 220 measures an electrical signal generated from the second cable module 202, and the third measurement module 230 measures an electrical signal generated from the third cable module 103.

Each of the first measurement module 210, the second measurement module 220, and the third measurement module 230 may include the first unit measurement unit 201 and the second unit measurement unit 202.

Referring to FIG. 7, the first measurement module 101, the second measurement module 102, and the third measurement module 103 are sequentially arranged inside the refractory 10 corresponding to the thickness t0 of the refractory 10 to be spaced apart from one another in the thickness direction of the refractory 10 from the molten material 30. The first measurement module 210 is connected to the first cable module 101, the second cable module 220 is connected to the second cable module 102, and the second measurement module 230 is connected to the third cable module 103.

As the refractory 10 is damaged by the molten material 30, the molten material 30 penetrates the refractory 10, as shown in FIG. 8. As a result, the first cable module 101, the second cable module 102, and the third cable module 103 are sequentially damaged by the molten material 30. Since the third cable module 103 is embedded in the boundary line t1 of the refractory 10, when the molten material 30 penetrates the refractory 10 to a depth "D", the third cable module 103 embedded in the refractory 10 to alert to the replacement time of the refractory 10 is damaged, resulting in change of the electrical signal measured by the third measurement module 230.

Accordingly, the integrated management module 300 can calculate an insertion location of the damaged cable module 100 based on the changed electrical signal and ascertain a penetration depth of the molten material 30 into the refractory 10.

In addition, the integrated management module 300 can ascertain a location of damage to refractory 10 in a plane perpendicular to the thickness direction of the refractory 10 based on locations of the first unit cable 110 and the second unit cable 120 damaged by the molten material 30.

Since the arrangement of the cable module 100 and the measurement module 200 with respect to the refractory 10 disposed in a continuous casting furnace is the same as that of the cable module 100 and the measurement module 200 with respect to the refractory 10 disposed in the steel making furnace 40 or the iron making furnace 50, description thereof will be omitted.

Now, an integrated heated member management system according to a second embodiment of the present invention will be described in detail.

FIG. 9 is a view showing placement of a cable module in the integrated heated member management system according to the second embodiment and FIG. 10 is a view of a first wire unit of the cable module in the integrated heated member management system according to the second embodiment.

Referring to FIG. 2, FIG. 9, and FIG. 10, the integrated heated member management system according to the second embodiment includes a heated member, a cable module 100, a measurement module 200, an integrated management module 300, and a local terminal 400.

Details of configurations of the measurement module 200, the integrated management module 300, and the local terminal 400 according to the second embodiment which are the same as those of the measurement module 200, the integrated management module 300, and the local terminal 400 according to the first embodiment will be omitted.

The measurement module 200 according to the second embodiment measures an electrical signal related to a current value generated from the cable module 100.

The cable module 100 according to the second embodiment is at least partially inserted into the heated member. Specifically, the cable module 100 includes a first wire unit 130 and a second wire unit 140 which are arranged adjacent to each other without being electrically connected to each other.

When the molten material 30 penetrates the heated member and thus the first wire unit 130 is electrically connected to the second wire unit 140 via the molten material 30, electric current flows between the first wire unit 130 and the second wire unit 140.

It should be understood that, if the molten material 30 does not reach a region where the first wire unit 130 and the second wire unit 140 are located, the first wire unit 130 remains electrically disconnected from the second wire unit 140.

The first wire unit 130 includes a metal wire 131, a coating layer 133 coated onto an outer surface of the metal wire 131 to prevent electrical connection between the first wire unit 130 and the second wire unit 140 during manufacture of the heated member, and a connection terminal 135 for connection to the measurement module.

The metal wire 111 may be formed of SUS, which is highly resistant to heat, to be prevented from being easily melted or expanded by heat transferred from the refractory 10. However, it should be understood that the present invention is not limited thereto and the metal wire 111 may be formed of any metal that is highly resistant to heat and has good current-carrying properties.

In addition, the metal wire 111 may have a structure in which a copper wire is centered to secure good current-carrying properties and a SUS wire surrounds the copper wire to prevent the copper wire from being easily melted by heat from the refractory 10.

The coating layer 133 may be formed of a material that does not melt during manufacture of the heated member, such as ceramic.

However, it should be understood that the present invention is not limited thereto and, when the heated member, for example a refractory, is nonconductive, the coating layer may be formed of a material that melts during a baking process in manufacture of the refractory.

For example, when the refractory is nonconductive, the coating layer may be provided in the form of a plastic tape wound on the metal wire. Here, the metal wire may have a protuberance protruding from a surface thereof or may have a refractory binding member, such as metal fibers, attached to the surface thereof, whereby a refractory holding area can be increased due to the protuberance or the refractory binding member, thereby reinforcing coupling between the refractory and the cable module.

Since the second wire unit 140 has substantially the same structure as the first wire unit 130, detailed description thereof will be omitted. Here, the first wire unit 130 and the second wire unit 140 may be disposed together inside a separate external case.

The measurement module 200 further includes a power supply unit 211.

Each of the first wire unit 110 and the second wire unit 120 is individually connected to the power supply unit 211. The sensing unit 212 described above measures electric current flowing through the first wire unit 130 and the second wire unit 140. The data transmission unit 213 transmits a current value measured by the sensing unit 212 to the integrated management module 300.

Thus, the measurement module 200 measures whether the first wire unit 130 is electrically connected to the second wire unit 140 via the molten material permeating the heated member.

The cable module 100 includes a first cable module 101, a second cable module 102, and a third cable module 103 which are arranged adjacent to one another in the thickness direction of the heated member, that is, the refractory 10.

Here, the measurement module 200 includes a first measurement module 210 measuring a first current value flowing through the first cable module 101, a second measurement module 220 measuring a second current value flowing through the second cable module 102, and a third measurement module 230 measuring a third current value flowing through the third cable module 103.

The integrated management module 300 can calculate an insertion location of the cable module damaged by the molten material 30 based on the first current value, the second current value, and the third current value and ascertain a penetration depth D of the molten material into the heated member.

Referring again to FIG. 3, FIG. 4, FIG. 7 and FIG. 8, in the integrated heated member management system according to the second embodiment, the arrangement of the cable module 100 and the measurement module 200 with respect to the refractory 10 disposed in the steel making furnace 40 or the iron making furnace 50 as the industrial furnace is the same as that of the cable module 100 and the measurement module 200 in the first embodiment of the present invention.

Since the arrangement of the cable module and the measurement module according to the second embodiment differs from the arrangement of the cable module and the measurement module according to the first embodiment only in that the measurement module 100 measures an electrical signal related to the current value of the cable module 200, detailed description thereof will be omitted.

Next, an integrated heated member management system according to a third embodiment of the present invention will be described in detail.

FIG. 11 is a view of an integrated heated member management system according to a third embodiment of the present invention, showing placement of a cable module in a purging plug disposed in a steel making furnace, FIG. 12 is a view showing configurations of main components of the cable module and a measurement module according to the third embodiment, FIG. 13 is a view showing penetration of a molten metal into the purging plug through a porous block according to the third embodiment, and FIG. 14 is a view showing penetration of a molten metal into the purging plug along an outer surface of a block case according to the third embodiment.

Referring to FIG. 2 and FIG. 11 to FIG. 14, the integrated heated member management system according to the third embodiment includes a heated member, a cable module 100, a measurement module 200, an integrated management module 300, and a local terminal 400.

Detailed description of configurations of the measurement module 200, the integrated management module 300, and the local terminal 400 according to the third embodiment which are the same as those of the measurement module 200, the integrated management module 300, and the local terminal 400 according to the first embodiment will be omitted.

In the third embodiment of the present invention, the heated member may be a purging plug 500 and the molten material may be a molten metal.

The cable module 100 is at least partially inserted into the purging plug 500.

Specifically, the cable module 100 includes a first wire unit 150, a second wire unit 160 disposed at a location separated a predetermined distance from the first wire unit 150 inside the purging plug 500 without being electrically connected to the first wire unit 150, and a connection member 170 formed of a nonconductive material and physically connecting the first wire unit 150 to the second wire unit 160.

The first wire unit 150 includes a first wire 151, a second wire 152 disposed adjacent to the first wire 151 without being electrically connected to the first wire 151, and a first wire cover 153 covering the first wire 151 and the second wire 152.

In addition, the second wire unit 160 includes a third wire 161, a fourth wire 162 disposed adjacent to the third wire 161 without being electrically connected to the third wire 161, and a second wire cover 163 covering the third wire 161 and the fourth wire 162.

Upon contact between the molten metal 30 and at least a portion of the cable module 100, the electrical connection state of the cable module 100 can be changed.

That is, when the molten metal 30 contacts the first wire unit 150 and melts a portion of the first wire unit 150, the first wire 151 and the second wire 152 are electrically connected to each other and thus electric current flows between the first wire 151 and the second wire 152.

Similarly, when the molten metal 30 contacts the second wire unit 160 and melts a portion of the second wire unit 160, the third wire 161 and the fourth wire 162 are electrically connected to each other and thus electric current flows between the third wire 161 and the fourth wire 162.

It should be understood that, if the molten metal 30 does not reach a region where the first wire unit 150 and the second wire unit 150 are located, no electric current flows through each of the first wire unit 150 and the second wire unit 160.

The cable module 100 may further include a first connection wire 154 electrically connecting the first wire unit 150 to the measurement module 200 and a second connection wire 164 electrically connecting the second wire unit 160 to the measurement module 200.

The purging plug 500 includes a porous block 510 allowing gas supply to an inner space of a ladle 70 therethrough, an inner refractory block 520 covering the porous block 510, a block case 530 covering the inner refractory block, an outer refractory block 550 surrounding the block case 530, and a gas injection pipe 540 allowing gas injection into the porous block 510 therethrough.

The porous block 510 includes a first porous block 511 forming a lower section of the purging plug 500 and a second porous block 512 disposed on an upper side of the first porous block 511.

Each of the first porous block 511 and the second porous block 512 may have a truncated cone shape. However, it should be understood that the present invention is not limited thereto and each of the first porous block 511 and the second porous block 512 may have various other shapes.

A gas introduced through the gas injection pipe 540 is supplied into the ladle 70 by passing through the porous block 510.

The ladle 70 is filled with a hot molten metal 30. Foreign matter contained in the molten metal 30 is floated to the surface of the molten metal 30 by the gas introduced through the porous block 510. The floated foreign matter is removed from the ladle by a separate removal device.

The inner refractory block 520 is disposed inside the block case 530 to secure the block case 530, the porous block 510, and the first wire unit 150 and second wire unit 160 of the cable module.

The block case 530 is formed of a metal and includes a protrusion 531 protruding toward the outer refractory block 550.

Here, the first wire 151 and the second wire 152 may be disposed on an inner surface of the protrusion 531. That is, the first wire unit 150 is disposed between an inner surface of the block case 530 and an outer surface of the porous block 510.

When the molten metal 30 reaches the outer surface of the protrusion 531 in the process of penetrating the purging plug 500 along the outer surface of the block case 530, the molten metal 30 melts the protrusion 531 and contacts the first wire unit 150 while the moving speed of the molten metal toward the lower section of the block case 530 is reduced.

When the molten metal 30 contacts the first wire unit 150 and melts a portion of the first wire unit 150, the first wire 151 is electrically connected to the second wire 152 via the molten metal 30 and the measurement module 200 measures change in current value flowing through the first wire unit 150.

The first wire unit 150, the connection member 130, and the second wire unit 120 are integrally placed in the same plane with respect to a bottom surface of the porous block 510.

Here, the second wire unit 160 is disposed in a central region of the porous block 510.

Since the first wire unit 150, the connection member 170, and the second wire unit 160 are integrally disposed between the first porous block 511 and the second porous block 512, manufacture of the purging plug 500 can be facilitated.

Now, a process of manufacturing the purging plug 500 will be briefly described.

First, among opposite cross-sections of the block case 530, a cross-section having a smaller diameter is placed on a plane. That is, when in actual use, the block case 530 is flipped upside down.

Then, among opposite cross-sections of the second porous block 512, a cross-section having a smaller diameter is placed on a plane to be located in an internal space of the block case 530.

Then, a wire unit assembly including the first wire unit 150, the connection member 170, and the second wire unit 160 integrally coupled to one another is placed on an upper side of a cross-section of the second porous block 512 having a larger diameter.

Here, the first wire unit 150 is placed on the protrusion 531 of the block case.

Particularly, the first wire unit 150 is placed on the protrusion 531 to tightly contact an upper inner surface of the protrusion 531, as shown in FIG. 11.

With the first wire unit 150 tightly contacting the upper inner surface of the protrusion 531, the molten metal 30 can easily contact the first wire unit 150 when penetrating the purging plug 500 along the outer surface of the block case 530 while melting the block case 530, whereby the electrical connection state of the first wire unit 150 can be more accurately measured.

Then, among opposite cross-sections of the first porous block 511, a cross-section having a smaller diameter is placed on an upper side of the second wire unit 160.

Here, each of the first connection wire 154 and the second connection wire 164 has a sufficient length to be connected to the measurement module 200.

Then, a molten refractory is injected into the internal space of the block case 530, followed by drying. The dried molten refractory forms the inner refractory block 520. In the process of forming the inner refractory block 520, the block case 530, the first porous block 511, and the second porous block 512 are secured.

Then, the gas injection pipe 540 is disposed to communicate with the first porous block 511.

However, it should be understood that the present invention is not limited thereto and the first wire unit 150 and the second wire unit 160 may be placed on different planes with respect to the bottom surface of the porous block 510.

The measurement module 200 measures change in electrical connection state of the cable module 100 due to the molten metal 30 penetrating the purging plug 500.

The measurement module 200 includes a power supply unit 211 and is disposed outside the purging plug 500.

Each of the first wire unit 150 and the second wire unit 160 is individually connected to the power supply unit 210.

The sensing unit 212 described above includes a first sensor 212a measuring electric current flowing through the first wire unit 150 and a second sensor 212b measuring electric current flowing through the second wire unit 160.

The data transmission unit 230 transmits information measured by the first sensor 212a and the second sensor 212b to the integrated management module 300.

The first sensor 212a may provide the integrated management module 300 with information for determining whether the first wire 151 and the second wire 152 are electrically connected to each other via the molten metal melting the block case 530 while moving along the outer surface of the block case 530.

That is, the first sensor 212a measures whether the first wire 151 and the second wire 152 are electrically connected to each other via the molten metal.

The second sensor 212b may provide the integrated management module 300 with information for determining whether the third wire 161 and the fourth wire 162 are electrically connected to each other via the molten metal penetrating the porous block 510.

That is, the second sensor 212b measures whether the third wire 161 and the fourth wire 162 are electrically connected to each other via the molten metal.

FIG. 13 shows a state in which the third wire 121 and the fourth wire 122 are electrically connected to each other via the molten metal 30 penetrating the purging plug through the porous block 510 and FIG. 14 shows a state in which the first wire 111 and the second wire 112 are electrically connected to each other via the molten metal 30 penetrating the purging plug along the outer surface of the block case 530.

Referring to FIG. 14, when the molten metal 30 flowing along the outer surface of the block case 530 melts the first wire 151 and second wire 152 tightly contacting the inner surface of the block case 530 while melting the block case 530, the first wire 151 and the second wire 152 are electrically connected to each other via the molten metal 30.

In this way, a degree of damage to the purging plug can be easily and accurately ascertained based on the phenomenon that two adjacent wires electrically disconnected from each other are electrically connected to each other via the molten metal.

Particularly, since the first wire unit 150 is disposed between the inner surface of the block case 530 and the outer surface of the porous block and the second wire unit 160 is disposed in the central region of the porous block 510, it is possible to easily determine whether the molten metal penetrates the purging plug 500 while moving along the outer surface of the block case 530 and whether the molten metal penetrates the porous block 510.

Next, an integrated heated member management system according to a fourth embodiment of the present invention will be described in detail.

FIG. 15 is a fragmentary perspective view of an integrated heated member management system according to a fourth embodiment of the present invention, showing placement of a cable module in a runner.

Referring to FIG. 2 and FIG. 15, the integrated heated member management system according to the fourth embodiment includes a heated member, a cable module 100, a measurement module 200, an integrated management module 300, and a local terminal 400.

Detailed description of configurations of the measurement module 200, the integrated management module 300, and the local terminal 400 according to the fourth embodiment of the present invention which are the same as those of the measurement module 200, the integrated management module 300, and the local terminal 400 according to the first embodiment of the present invention will be omitted.

In the fourth embodiment of the present invention, the heated member may be a runner refractory 730. The runner refractory 730 is disposed in a runner 700 allowing a molten material (not shown) to move therethrough and prevents the molten material from contacting a steel shell case 710 of the runner.

That is, the runner refractory 730 prevents the steel shell case 710 of the runner from being damaged by the molten material.

Referring to FIG. 15, the runner 700 includes the steel shell case 710 disposed at an outer portion thereof to guide movement of the molten material (not shown), a high-strength refractory 720 disposed inside the steel shell case 710 to protect the steel shell case 710 from the molten material, and the runner refractory 730 disposed inside the high-strength refractory 720 to allow the molten material to directly move therethrough.

The cable module according to the fourth embodiment of the present invention includes a first cable module 191, a second cable module 193, and a third cable module 195.

The first cable module 191 may be disposed inside one partition of the runner refractory 730.

The first cable module 191 includes a first planar cable module 191a having a mesh shape and a second planar cable 191a having the same shape as the first planar cable 191a and disposed separated a predetermined distance from the first planar cable module 191a.

However, it should be understood that the present invention is not limited thereto and the number of planar cable modules may be varied depending on the size and structure of the runner refractory 730.

The second cable module 193 may be disposed inside the other partition of the runner refractory 730.

The second cable module 193 may include a third planar cable module 193a and a fourth planar cable module 193b having the same shapes as the first planar cable module 191a and the second planar cable module 191b.

The third cable module 195 may be disposed inside a bottom of the runner refractory 730.

The third cable module 195 may include a fifth planar cable module 195a and a sixth planar cable module 195b having the same shapes as the first planar cable module 191a and the second planar cable module 191b.

Here, the first planar cable module 191a, the third planar cable module 193a, and the fifth planar cable module 195a may be disposed in proximity to the molten material moving in the runner refractory 730, and the second planar cable module 191b, the fourth planar cable module 193b, and the sixth planar cable module 195b may be disposed inside the runner refractory to be in proximity to the steel shell case 710.

Although not shown in the drawings, each of the planar cable modules may be composed of a plurality of first unit cables and a plurality of second unit cables crossing the respective first unit cables and spaced apart from one another. Due to such an arrangement of the unit cables, each planar cable module can have a mesh shape.

However, it should be understood that the present invention is not limited thereto and each of the planar cable modules may have a structure in which a linear cable is disposed on a plane in a spiral, serpentine, or straight line shape, rather than having a mesh shape.

Although not shown in the drawings, the measurement module may include a first measurement module, a second measurement module, and a third measurement module.

The first measurement module may include a first planar measurement module and a second planar measurement module which are connected to the first planar cable module 191a and the second planar cable module 191b to measure electrical signals generated from the first planar cable module 191a and the second planar cable module 191b, respectively.

The second measurement module may include a third planar measurement module and a fourth planar measurement module which are connected to the third planar cable module 193a and the fourth planar cable module 193b to measure electrical signals generated from the third planar cable module 193a and the fourth planar cable module 193b, respectively.

The third measurement module may include a fifth planar measurement module and a sixth planar measurement module which are connected to the fifth planar cable module 195a and the sixth planar cable module 195b to measure electrical signals generated from the fifth planar cable module 195a and the sixth planar cable module 195b, respectively.

Although not shown in the drawings, each of the planar measurement modules may include first unit measurement modules and second unit measurement modules which are connected to the plurality of first unit cables and the plurality of second unit cables, respectively.

Upon damage to the runner refractory 730 by the molten material, the molten material penetrates the runner refractory 730. As the molten material penetrates the runner refractory 730, the first planar cable module 191a, the third planar cable module 193a, and the fifth planar cable module 195a, which are disposed in proximity to the molten material, are primarily damaged. As the first planar cable module 191a, the third planar cable module 193a, and the fifth planar cable module 195a are damaged, electrical signals measured by the first planar measurement module, the third planar measurement module, and the fifth planar measurement module are changed.

That is, the degree and location of damage to the runner refractory 730 can be primarily ascertained based on respective electrical signals changed as the first planar cable module 191a, third planar cable module 193a, and fifth planar cable module 195a disposed in proximity to the molten material is damaged by the molten material penetrating the runner refractory 730.

In addition, the molten material penetrating the runner refractory secondarily damages the second planar cable module 191b, the fourth planar cable module 193b, and the sixth planar cable module 195b, which are disposed in proximity to the steel shell case 710. As the second planar cable module 191b, the fourth planar cable module 193b, and the sixth planar cable module 195b are damaged, electrical signals measured by the second planar measurement module, the fourth planar measurement module, and the sixth planar measurement module are changed.

That is, the degree and location of damage to the runner refractory 730 can be secondarily ascertained based on respective electrical signals changed as the second planar cable module 191b, the fourth planar cable module 193b, and the sixth planar cable module 193b disposed in proximity to the steel shell case 710 is damaged by the molten material penetrating the runner refractory 730.

When electrical signals indicative of damage to the second planar cable module 191b, the fourth planar cable module 193b, and the sixth planar cable module 195b by the molten material are measured, it is determined that the runner refractory 730 should be removed from the steel shell case 710 and replaced since the molten material can damage the steel shell case.

Although not shown in the drawings, each of the planar cable modules may be disposed in a separate cable block (not shown), wherein the separate cable blocks may be disposed on the opposite partitions and bottom of the runner refractory 730, respectively.

Next, a method for controlling the integrated refractory management system according to the present invention will be described.

FIG. 16 is a flowchart of a method for controlling the integrated heated member management system according to one embodiment of the present invention. In the embodiment shown in FIG. 16, the refractory is a purging plug.

Referring to FIG. 2, FIG. 3, and FIG. 16, a method for controlling the integrated refractory management system according to the present invention includes the steps of measuring information (S10), ascertaining the condition of a refractory (S20), displaying alarm information (S30), displaying condition of the refractory (S40), and transmitting a command to the local terminal (S50).

In the step of measuring information (S10), information generated from the cable module 100 is measured by the measurement module 200.

The information measured in the step of measuring information (S10) may be an electrical signal related to a resistance value or current value changed due to damage to the cable module 100 upon damage to the heated member by the molten material 30 or may be an electrical signal related to change in electrical connection state of the cable module 100 due to the molten material 30 penetrating the purging plug 500.

In the step of ascertaining the condition of the refractory (S20), the information measured by the measurement module 200 is analyzed by the integrated management module 300 to ascertain a degree of damage to the refractory 10.

When the information measured in the step of measuring information (S10) is an electrical signal related to the changed resistance value or current value, in the step of ascertaining the condition of the refractory (S20), an insertion position of the damaged cable module 100 is calculated based on the changed resistance value or current value and a penetration depth of the molten material into the heated member is ascertained based on the insertion position of the damaged cable module 100.

In the step of displaying alarm information (S30), alarm information is displayed by the alarm unit disposed adjacent to the refractory 10 when the refractory 10 is not in a normal state.

In the step of displaying condition of the refractory (S40), the condition of the refractory 10 is displayed on the data output unit 370 by the integrated management module 300.

In the step of transmitting the command to the local terminal S50, the management information on the refractory 10 is generated and transmitted to the local terminal 400 by the integrated management module 300.

Referring to FIG. 2, FIG. 13, and FIG. 16, when the information measured in the step of measuring information (S10) is an electrical signal related to change in electrical connection state of the cable module 100, the step of ascertaining the condition of the refractory (S20) may include determining whether the molten material 30 reaches a first predetermined location in the purging plug 500 while moving along the outer surface of the block case 530 and determining whether the molten material 30 reaches a second predetermined location in the porous block 510.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the invention.

INDUSTRIAL APPLICABILITY

The present invention may be applied to an integrated heated member management system which can promptly ascertain thermal shock-induced damage to a heated member disposed inside various industrial furnaces (for example, a heating furnace, a heat treatment furnace, a calcining furnace, a blast furnace runner, etc.) used in a steel mill, a power plant, a glass molding plant, and the like.

In addition, the present invention may be applied to an integrated heated member management system which can easily ascertain the location and degree of damage to a heated member.

Further, the present invention may be applied to an integrated heated member management system which can manage a heated member in an industrial furnace to prevent heat loss of the industrial furnace, damage to external equipment, and accidents to onsite operators due to damage to the heated member.

The invention claimed is:

1. An integrated heated member management system providing integrated management of damage to a heated member by a hot molten material, the integrated heated member management system comprising:
  a cable module at least partially inserted into the heated member;
  a measurement module disposed outside the heated member and measuring information generated from the cable module;
  an integrated management module ascertaining a degree of damage to the heated member by the molten material based on the information measured by the measurement module, displaying a changed condition of the heated member, and generating management information on the heated member; and
  a local terminal receiving the management information on the heated member from the integrated management module,
  wherein the cable module including multiple cable modules installed in a thickness direction of the heated member comprises:
    a plurality of first unit cables separated from one another; and a plurality of second unit cables separated from one another and crossing the plurality of first unit cables, respectively, wherein the plurality of first unit cables and the plurality of second unit cables form a mesh structure on a plane perpendicular to the thickness direction of the heated member, wherein the integrated management module is configured to ascertain a location of damage to the heated member in the plane perpendicular to the thickness direction of the heated member based on locations of the plurality of first unit cables and the plurality of second unit cables damaged by the molten material, and simultaneously ascertain a penetration depth of the molten material into the heated member based on an insertion location of the damaged cable module.

2. The integrated heated member management system according to claim 1, wherein the measurement module measures a resistance value changed as the cable module is damaged due to damage to the heated member by the molten material.

3. The integrated heated member management system according to claim 2, further comprising:

a fixed resistance unit disposed between the cable module and the measurement module and having a predetermined resistance value, wherein the cable module, the measurement module, and the fixed resistance unit form a closed loop.

4. The integrated heated member management system according to claim 1, wherein the measurement module measures an electrical signal generated from the cable module and comprises: first unit measurement units coupled one-to-one to the first unit cables to measure electrical signals generated from the first unit cables; and second unit measurement units coupled one-to-one to the second unit cables to measure electrical signals generated from the second unit cables.

5. The integrated heated member management system according to claim 1, wherein the heated member comprises: a refractory; and a purging plug supplying bubbles to the molten material and coupled to a through-hole formed through the refractory in a thickness direction of the refractory, the purging plug comprising a residue measurement block in which at least a portion of the cable module is disposed.

6. The integrated heated member management system according to claim 1, wherein the measurement module comprises a first measurement module measuring a first current value flowing through the first cable module and a second measurement module measuring a second current value flowing through the second cable module, and the integrated management module calculates an insertion location of the cable module damaged by the molten material based on the first current value and the second current value and ascertains a penetration depth of the molten material into the heated member based on the insertion location of the damaged cable module.

7. The integrated heated member management system according to claim 1, wherein the measurement module comprises: a sensing unit measuring an electrical signal generated from the cable module; and a data transmission unit transmitting the electrical signal measured by the sensing unit to the integrated management module, and the integrated management module comprises: a data reception unit receiving the electrical signal from the data transmission unit; a data analysis unit ascertaining the degree of damage to the heated member through analysis of the electrical signal received by the data reception unit; a data output unit displaying the degree of damage to the heated member ascertained by the data analysis unit to monitor a condition of the heated member; and a management instruction unit generating management information on the heated member based on the degree of damage to the heated member ascertained by the data analysis unit and transmitting the management information to the local terminal.

8. The integrated heated member management system according to claim 1, wherein the heated member is a runner refractory disposed in a runner, the cable module comprises: a first cable module disposed inside one partition of the runner refractory; a second cable module disposed inside the other partition of the runner refractory; and a third cable module disposed inside a bottom of the runner refractory, and the measurement module comprises: a first measurement module connected to the first cable module and measuring an electrical signal generated from the first cable module; a second measurement module connected to the second cable module and measuring an electrical signal generated from the second cable module; and a third measurement module connected to the third cable module and measuring an electrical signal generated from the third cable module.

9. A method for controlling the integrated heated member management system according to claim 1, comprising the steps of:

measuring, by the measurement module, information generated from the cable module;

ascertaining, by an integrated management module, a degree of damage to the heated member through analysis of the information measured by the measurement module;

displaying, by the integrated management module, the degree of damage to the heated member; and generating, by the integrated management module, management information on the heated member and transmitting, by the integrated management module, the management information on the heated member to the local terminal.

10. The method according to claim 9, wherein the information measured in the step of measuring information generated from the cable module is an electrical signal related to a resistance value or current value changed as the cable module is damaged due to damage to the heated member by the molten material, and the step of ascertaining the degree of damage to the heated member comprises calculating an insertion location of the damaged cable module based on the changed resistance value or current value and ascertaining a penetration depth of the molten material into the heated member based on the insertion location of the damaged cable module.

11. The method according to claim 9, wherein the heated member is a purging plug, the molten material is a molten metal, wherein the information measured in the step of measuring information generated from the cable module is an electrical signal related to change in electrical connection of the cable module due to the molten metal penetrating the purging plug, and the step of ascertaining the degree of damage to the purging plug comprises determining whether the molten metal reaches a first predetermined location in the purging plug while moving along an outer surface of the block case and determining whether the molten metal reaches a second predetermined location in the porous block.

12. An integrated heated member management system providing integrated management of damage to a heated member by a hot molten material, the integrated heated member management system comprising:
   a cable module at least partially inserted into the heated member;
   a measurement module disposed outside the heated member and measuring information generated from the cable module;
   an integrated management module ascertaining a degree of damage to the heated member by the molten material based on the information measured by the measurement module, displaying a changed condition of the heated member, and generating management information on the heated member; and
   a local terminal receiving the management information on the heated member from the integrated management module,
   wherein the heated member is a purging plug,
   the molten material is a molten metal, and
   the measurement module measures change in electrical connection state of the cable module due to the molten metal penetrating the purging plug,
   wherein the cable module including multiple cable modules installed in the thickness direction of the purging plug comprises:
      a first wire unit having a first wire and a second wire arranged adjacent to one another without being electrically connected to one another; and
      a second wire unit having a third wire and a fourth wire arranged adjacent to one another without being electrically connected to one another,
   wherein the first wire unit and the second wire units are arranged in a plane perpendicular to the thickness direction of the purging plug, and the second wire unit is disposed at a location separated a predetermined distance from the first wire unit inside the purging plug without being electrically connected to the first wire unit,
   wherein the integrated management module is configured to
      ascertain a location of damage to the purging plug in the plane perpendicular to the thickness direction of the purging plug based on changes in the electrical connection state of the first wire unit or the second wire unit, which contacts with the molten metal, and simultaneously ascertain a penetration depth of the molten metal into the purging plug based on an insertion location of the damaged cable module.

13. The integrated heated member management system according to claim 12, wherein the purging plug comprises a porous block allowing gas supply to an internal space of a ladle therethrough, an inner refractory block covering the porous block, a block case covering the inner refractory block, an outer refractory block surrounding the block case, and a gas injection pipe allowing gas injection into the porous block therethrough, the block case comprising a protrusion protruding toward the outer refractory block, and the first wire and the second wire are disposed on an inner surface of the protrusion.

14. The integrated heated member management system according to claim 13, wherein the cable module further comprises a connection member formed of a nonconductive material and physically connecting the first wire unit to the second wire unit.

15. The integrated heated member management system according to claim 14, wherein the first wire unit, the connection member, and the second wire unit are integrally disposed on the same plane with respect to a bottom surface of the porous block, the first wire unit is disposed between an inner surface of the block case and an outer surface of the porous block, and the second wire unit is disposed in a central region of the porous block.

16. The integrated heated member management system according to claim 14,
   wherein the cable module further comprises a first connection wire connecting the first wire unit to the measurement module and a second connection wire connecting the second wire unit to the measurement module,
   the first wire unit further comprises a first wire cover covering the first wire and the second wire, and
   the second wire unit further comprises a second wire cover covering the third wire and the fourth wire.

17. The integrated heated member management system according to claim 13, wherein the measurement module comprises:
   a power supply unit to which each of the first wire unit and the second wire unit is individually connected;
   a first sensor measuring electric current flowing through the first wire unit;
   a second sensor measuring electric current flowing through the second wire unit; and
   a data transmission unit transmitting information measured by the first sensor and the second sensor to the integrated management module.

18. The integrated heated member management system according to claim 17,
   wherein the first sensor provides the integrated management module with information for determining whether the first wire is electrically connected to the second wire via the molten metal melting the block case while moving along an outer surface of the block case, and
   the second sensor provides the integrated management module with information for determining whether the third wire is electrically connected to the fourth wire via the molten metal penetrating the porous block.

* * * * *